(12) United States Patent
Rossman et al.

(10) Patent No.: US 6,559,026 B1
(45) Date of Patent: May 6, 2003

(54) TRENCH FILL WITH HDP-CVD PROCESS INCLUDING COUPLED HIGH POWER DENSITY PLASMA DEPOSITION

(75) Inventors: Kent Rossman, San Jose, CA (US); Zhuang Li, San Jose, CA (US); Young Lee, Kyunggi-do (KR)

(73) Assignee: Applied Materials, Inc, Santa Clara, CA (US)

( * ) Notice: Subject to any disclaimer, the term of this patent is extended or adjusted under 35 U.S.C. 154(b) by 0 days.

(21) Appl. No.: 09/579,822

(22) Filed: May 25, 2000

(51) Int. Cl.$^7$ .................... H01L 21/76; H01L 21/31; H01L 21/469; H05H 1/24
(52) U.S. Cl. ............... 438/424; 438/787; 438/788; 427/578; 427/579; 427/569
(58) Field of Search ................ 438/424, 787, 438/788; 427/578, 579, 569

(56) References Cited

U.S. PATENT DOCUMENTS 4,690,746 A    9/1987    McInerney et al.

(List continued on next page.)

FOREIGN PATENT DOCUMENTS

| GB | 2 267 291 A | 12/1993 |
| JP | 2-58836 A | 2/1990 |
| JP | 7-161703 A | 6/1995 |

OTHER PUBLICATIONS

Nalwa, H.S., *Handbook of Low and High Dielectric Constant Materials and Their Applications*, vol. 1, p. 66 (1999).

(List continued on next page.)

Primary Examiner—John F. Niebling
Assistant Examiner—Ron Pompey

(74) *Attorney, Agent, or Firm*—Townsend and Townsend and Crew

(57) ABSTRACT

A trench-fill material is deposited to fill a trench in a substrate disposed in a process chamber. An inert gas is introduced into the process chamber and a plasma is formed to heat the substrate to a preset temperature, which is typically the temperature at which deposition of the trench-fill material is to take place. The plasma is terminated upon reaching the preset temperature for the substrate. A process gas is then flowed into the process chamber without plasma excitation until the process gas flow and distribution achieve a generally steady state in the process chamber. A plasma is then formed to deposit the trench-fill material on the surface of the substrate and fill the trench. By establishing generally steady state conditions in the chamber prior to deposition, transient effects are reduced and more uniform deposition of the trench-fill material is obtained. The step of forming the plasma typically includes coupling source plasma energy into the process chamber at a total power density of at least about 15 Watts/cm$^2$. The energy is inductively coupled into the process chamber by coupling a top coil with a top portion of the process chamber above the surface of the substrate and coupling a side coil with a side portion of the process chamber generally surrounding the side edge of the substrate. The top coil is powered at a top RF power level to produce a top power density and the side coil is-powered at a side RF power level to produce a side power density. The total RF power density is equal to the sum of the top and side power densities. The top power density and the side power density desirably have a ratio of at least about 1.5. The high source plasma power density generates a high ion density plasma and produces a more directional deposition, and a higher top power density relative to the side power density produces a more uniform plasma over the substrate, resulting in improved trench fill, particularly for aggressive trenches having aspect ratios of about 3:1 to 4:1. The process gas typically includes silicon, oxygen, and an inert component having a concentration of less than about 40%, by volume. In specific embodiments, the concentration of the inert component is equal to about 0%.

29 Claims, 15 Drawing Sheets

U.S. PATENT DOCUMENTS

| | | | |
|---|---|---|---|
| 4,737,379 A | | 4/1988 | Hudgens et al. |
| 4,835,005 A | | 5/1989 | Hirooka et al. |
| 4,890,575 A | | 1/1990 | Ito et al. |
| 5,645,645 A | * | 7/1997 | Zhang et al. |
| 5,712,185 A | | 1/1998 | Tsai et al. ..................... 437/67 |
| 5,719,085 A | | 2/1998 | Moon et al. ................ 438/424 |
| 5,804,259 A | * | 9/1998 | Robles |
| 5,872,058 A | | 2/1999 | Van Cleemput et al. .... 438/692 |
| 5,910,342 A | | 6/1999 | Hirooka et al. |
| 5,976,327 A | * | 11/1999 | Tanaka |
| 5,990,005 A | * | 11/1999 | Hirose et al. ............... 438/660 |
| 5,990,013 A | | 11/1999 | Berenguer et al. |
| 6,004,863 A | * | 12/1999 | Jang ........................... 438/427 |
| 6,013,191 A | * | 1/2000 | Nasser-Faili et al. |
| 6,013,584 A | | 1/2000 | M'Saad |
| 6,030,881 A | | 2/2000 | Papasouliotis et al. |
| 6,039,851 A | | 3/2000 | Iyer |
| 6,127,238 A | * | 10/2000 | Liao et al. .................. 438/382 |
| 6,140,249 A | * | 10/2000 | Sharan ....................... 438/765 |
| 6,153,523 A | * | 11/2000 | Van Ngo et al. ............ 438/687 |
| 6,194,038 B1 | | 2/2001 | Rossman |
| 6,217,658 B1 | * | 4/2001 | Orczyk et al. |
| 6,228,751 B1 | | 5/2001 | Yamazaki et al. |
| 6,313,010 B1 | * | 11/2001 | Nag et al. |
| 6,395,150 B1 | | 5/2002 | Van Cleemput et al. |

OTHER PUBLICATIONS

Nguyen, s.v., "High–Density Plasma Chemical Vapor Deposition of Silicon–Based Dielectric Films for Integrated Circuits," *Journal of Research and Development*, vol. 43, 1–2 (1999).

Vassiliev et al., "Trends in Void–Free Pre–Metal CVD Dielectrics," *Solid State Technology*, pp. 129–136 (Mar. 2001).

* cited by examiner

TRENCH FILL WITH HDP-CVD PROCESS INCLUDING COUPLED HIGH POWER DENSITY PLASMA DEPOSITION

BACKGROUND OF THE INVENTION

The present invention relates to the fabrication of integrated circuits. More particularly, the present invention is directed toward a method and apparatus for achieving void-free trench fill on substrates having high aspect ratio trenches.

Semiconductor device geometries continue to decrease in size, providing more devices per unit area on a fabricated wafer. These devices are initially isolated from each other as they are built into the wafer, and they are subsequently interconnected to create the specific circuit configurations desired. Currently, some devices are fabricated with feature dimensions as small as 0.08 $\mu$m. For example, spacing between devices such as conductive lines or traces on a patterned wafer may be separated by 0.08 $\mu$m leaving recesses or gaps of a comparable size. A nonconductive layer of dielectric material, such as silicon dioxide, is typically deposited over the features to fill the aforementioned gap and insulate the features from other features of the integrated circuit in adjacent layers or from adjacent features in the same layer.

Shallow trench isolation ("STI") is a technique for isolating devices having feature dimensions of under about 1 $\mu$m. FIG. 1 shows an example of an STI trench substrate 10, such as a semiconductor wafer, having two islands 12 covered by a trench mask 13. A trench 14 is disposed between the two islands 12 which define the sidewalls 16 of the trench 14. The mask 13 is typically a patterned trench mask layer made of a relatively hard material such as silicon nitride (SiN) used in forming the trench. A thermal oxide layer (not shown) is grown on the surfaces of the trench 14. The silicon nitride mask 13 prevents oxidation of the silicon substrate 10 where active devices are to be formed, and is also referred to as the oxidation mask. The trench 14 is filled by depositing an insulating or dielectric material 18 such as silicon dioxide over the entire trench mask 13. The silicon dioxide overfills the trench 14 to create an irregular top surface topography. The excess material along with the silicon nitride mask 13 is typically removed to planarize the trench 14 so that the trench-fill material 18 is flush with the islands 12.

One gap-fill issue encountered when the feature dimensions of the integrated circuits decrease is that it becomes difficult to fill the trenches, as in the case of STI structures. This problem is referred to as the gap-fill problem and is described below in conjunction with FIGS. 1 and 2. In the vertical cross-sectional view of FIG. 1, the sidewalls 16 of the trench are formed by one edge of each of the two adjacent islands 12. During deposition, dielectric gap-flu material 18 accumulates on the surfaces 20 of the islands 12 as well as on the substrate surface, and forms overhangs 22 located at the corners 24 of the islands 12. As deposition of the gap-fill material 18 continues, the overhangs 22 typically grow together faster than the trench 14 is filled until a dielectric layer 26 is formed, creating an interior void 28, shown more clearly in FIG. 2. In this fashion, the dielectric layer 26 prevents deposition into the interior void 28. The interior void 28 can be problematic to device fabrication, operation, and reliability.

Many different techniques have been implemented to improve the gap-filling characterstics of dielectric layers, including deposition etch-back (dep-etch) techniques. One such dep-etch technique involves physical sputtering of the dielectric layer by ion bombardment to prevent the formation of voids during a deposition process. The effects of the physical sputtering dep-etch technique is shown in FIG. 3. As shown in FIG. 3, ions 30 incident on the dielectric material transfer energy thereto by collision, allowing atoms 32 to overcome local binding forces and eject therefrom. During the dep-etch technique, dielectric material fills the trench 14 forming a surface 34. The surface 34 lies in a plane that extends obliquely to the sidewalls 16, commonly referred to as a facet. This dep-etch technique may be applied sequentially so that the dielectric layer 26 is deposited and then subsequently etched followed by deposition of additional dielectric material. Alternatively, the deposition process and the etch process may occur concurrently. Whether the deposition and etching are sequential or concurrent, the first order effects on the profile of the surface of the dielectric layer 26 profile are the same.

Typically, a plasma-chemical vapor deposition (CVD) process is employed to deposit a dielectric layer using the dep-etch technique. A plasma is generated to produce chemical reactive plasma species (atoms, radicals, and ions) that are absorbed on the surface of the substrate. For example, a plasma-enhanced chemical vapor deposition (PECVD) process, including a high-density plasma-chemical vapor deposition (HDP-CVD) process (e.g., a plasma formed by applying RF power to an inductive coil or by electron cyclotron resonance chemical vapor deposition (ECR-CVD) process), may be employed. The plasma CVD processes typically allow deposition of high quality films at lower temperature and with faster deposition rates than are typically possible employing purely thermally activated CVD processes.

Referring to FIGS. 3 and 4, after an extended dep-etch technique, the portion of the dielectric layer 26 positioned adjacent to the corners 24, regardless of the spacing between the conductive features 12, has a surface 34 that forms an oblique angle with respect to the plane in which the substrate 10 lies. Thereafter, planarization may be accomplished by an extended planarization etch technique where physical sputtering is balanced with the deposition so that very narrow features become completely planarized. Alternatively, a separate planarization process may be employed that is capable of smoothing or eliminating the remaining steps of the large features.

Another gap-fill issue arises when the gap dimensions become increasingly narrow and deep so that the void 28 of FIG. 2 that can form will be deep. Such a gap is characterized by a high aspect ratio, which is defined as the depth of the gap divided by its width, of typically greater than about 3:1. It is difficult to achieve gap fill for deep voids without clipping or sputtering the silicon nitride mask 13. This clipping problem is described in connection with FIG. 5. To achieve void-free gap fill, conventional approaches decrease the deposition rate relative to the sputter rate to keep the gap open during the dep-etch process. To continue improving gap fill, lower deposition-to-sputter or deposition-to-etch (dep-etch) ratios become necessary. The lower dep-etch ratio causes the oblique facet 34 to move further apart and closer to the silicon nitride mask 13. If the dep-etch ratio is sufficiently low, the facet 34 will reach the silicon nitride mask 13 and the corners 24 of the mask 13 will be sputtered or clipped, as illustrated in FIG. 5. The clipping raises integration concerns during planarization and can lead to gate wrap around and device performance degradation.

Providing void-free gap fill is also important in processes such as the formation of inter-metal dielectric (IMD) layers, and pre-metal dielectric (PMD) layers. In an IMD process, for example, an insulating layer of typically an undoped $SiO_2$ or fluorine-doped oxide is formed between metal interconnect layers. Although clipping of the metal interconnect layers generally does not occur, similar problems of forming a void-free gap-fill layer with superior gap-filling characteristics arise, particularly for high aspect ratio gaps.

What is needed is a method and an apparatus for depositing a gap-fill layer on a substrate with superior gap filling characteristics and little or no clipping of trench masks or other circuit elements.

SUMMARY OF THE INVENTION

The present invention provides a method and apparatus for depositing a dielectric layer employing a dep-etch technique to perform gap fill with little or no void formation and clipping. The invention achieves void-free gap fill by raising the source plasma power densities to increase the ion density and to generate a more directional deposition oriented into the gap, and by shifting the source plasma power density to concentrate a higher percentage of the power density above the gap to be filled to produce a more uniform deposition over the substrate.

The gap-fill layer is deposited employing a high-density plasma-chemical vapor deposition (RDP-CVD) system, such as an Applied Materials, Inc. Ultima HDP-CVD System Typically, a shallow trench having a high aspect ratio of about 3:1 or higher may be present on a substrate upon which the dielectric layer is to be deposited, with the substrate being positioned in a process chamber of the HDP-CVD system. Deposition gases, such as a silicon source gas and an oxygen source gas are flowed across the surface of the substrate along with an inert gas. An RF source generator and an RF bias generator are each in electrical communication with the process chamber to form a plasma from the process gas mixture (deposition and inert gases) to generate reactive plasma species for sputtering. The energy from the RF source generator is inductively coupled into the process chamber, while the energy from the RE bias generator is capacitively coupled into the process chamber.

Although sputtering can eliminate overhangs and keep the gap open during gap fill, excessive sputtering can lead to void formation by redeposition of the sputtered material The gap-fill dep-etch chemistry is preferably adjusted to control the sputter rate relative to deposition rate to reduce or eliminate void formation caused by redeposition. For instance, the amount of the inert gas component in the process gas can be adjusted to raise or lower the sputtering energy and the sputter rate and can be optimized to achieve superior gap-filling characteristics. Moreover, redeposition is less likely to occur at high temperatures because the sputtered material will tend to return to the vapor phase upon contact with a hot surface.

In accordance with an aspect of the invention, a process gas is flowed into a process chamber in a method for depositing a layer on a surface of a substrate having a trench and disposed in the process chamber. The substrate has a side edge generally surrounding the surface. The process gas includes silicon, oxygen, and an inert component. The concentration of the inert component in the process gas is less than about 40%, in volume. A plasma is formed in the process chamber to deposit the layer on the surface of the substrate and fill the trench, The formation of the plasma includes coupling source plasma energy into the process chamber at a total substrate power density of at least about 15 Watts/cm$^2$. In one embodiment, the energy is inductively coupled into the process chamber by coupling a top RF coil at a top RF power level with a top portion of the process chamber above the surface of the substrate to produce a top power density, and coupling a side RF coil at a side RF power level with a side portion of the process chamber generally surrounding the side edge of the substrate to produce a side power density. The total power density is equal to the sum of the top power density and the side power density. The top power density and the side power density have a ratio of at least about 1.5, more desirably at least about 2. This represents a significant shift of power concentration to the top from a ratio of typically about 0.4 in previous processes. In one embodiment, the top power density is about 13.7 Watts/cm$^2$ to about 16.9 Watts/cm$^2$, and the side RF power density is about 4.1 Watts/cm$^2$ to about 7.6 Watts/cm$^2$, and the concentration of the inert component is less than about 15%, by volume. In a specific embodiment, the concentration of the inert component is about 0%.

The reduction in the concentration of inert gases may also avoid clipping during trench fill. For instance, the present invention substantially avoids sputtering the trench mask or sputters the trench mask at a substantially lower rate than the sputter rate of the trench-fill dielectric material in an STI procedure. This is accomplished by adjusting the trench-fill dep-etch chemistry, Specifically, it was discovered that the energy required to sputter the trench mask which is typically formed from silicon nitride is higher than that required to sputter the dielectric material such as silicon dioxide. The sputtering energy of the reactive plasma species varies with changes in the chemistry of the process gas mixture. The chemistry can be selected to produce predominantly plasma species that have sputtering energy sufficient to sputter the dielectric material but insufficient to cause any significant sputtering of the trench mask. For instance, it was discovered that argon ions have enough sputtering energy to sputter silicon dioxide dielectric material and silicon nitride mask, while oxygen ions have sputtering energy sufficient to sputter silicon dioxide, but cause little or no sputtering of silicon nitride. In this fashion, the sputter rate of the trench mask is substantially decreased relative to the sputter rate of the dielectric material, thereby reducing the possibility of clipping the trench mask The decreased trench mask sputter rate allows decreasing the deposition rate of the dielectric material relative to its sputter rate to achieve void-free trench fill with little or no trench mask clipping.

To further improve gap-filling characteristics, the inventors have discovered that it is advantageous to reduce or eliminate the transient effects during the initial deposition of the gap-fill layer, particularly for filling gaps with very high aspect ratios of greater than about 4:1. The transient effects produce nonuniform deposition which typically manifests itself in void formation in the gap-fill layer. The present invention reduces transient effects by introducing an inert gas into a process chamber and striking a plasma to heat the substrate to a preset temperature, which may be the temperature at which deposition is to occur. Upon reaching the preset temperature, the plasma is turned off and the process gas is flowed into the chamber without plasma excitation until the process gas flow and distribution achieve a generally steady state or equilibrium in the chamber so that the gas components of the process gas are uniformly provided to the surface of the substrate. A plasma is then formed to deposit the gap-fill layer on the surface of the substrate and fill the trench in the substrate. The preset temperature is typically about 350–450° C. for If and about 600–760° C. for STI, for example.

For a further understanding of the objects and advantages of the present invention, reference should be made to the ensuing detailed description taken in conjunction with the accompanying drawings.

DESCRIPTION OF THE SPECIFIC EMBODIMENTS

I. Introduction

An aspect of the present invention is based on achieving void-fee gap fill by raising the source plasma power densities to increase the ion density and to generate a more directional deposition oriented into the gap, and by shifting the source plasma power density to concentrate a higher percentage of the power density above the gap to be filled to produce a more uniform deposition over the substrate. Another aspect of the invention relates to reducing or eliminating the transient effects during the initial deposition of the gap-fill layer by striking a plasma with an inert gas in the process chamber to heat the substrate to a temperature generally equal to that at which deposition is to occur. The process gas is then flowed into the chamber without plasma excitation to allow the process gas flow and distribution to achieve a generally steady state or equilibrium in the chamber before a plasma is formed to deposit the gap-fill layer.

Another aspect of the present invention is based on shifting the dep-etch gap-fill chemistry so that little or no trench mask material can be sputtered in an STI application. The rate of sputter deposition is determined largely by sputtering yield. Sputtering yield is a function of the angle of incidence of the bombarding ions relative to the target material. In addition, sputtering yield also depends on factors that include the target material, mass of the bombarding ions, and energy of the bombarding ions. There is a minimum threshold energy for sputtering that is approximately equal to the heat of sublimation (e.g., 13.5 eV for silicon). In the energy range of sputtering (10–5000 eV), the sputtering yield increases with ion energy and mass. For instance, argon has a much higher energy of collision for sputtering than oxygen because oxygen is less than half in mass compared to argon. As a result, argon has a much higher sputtering yield than oxygen. It is possible, therefore, to select and manipulate gap-fill chemistry to provide significantly less sputtering yield for the trench mask layer than for the dielectric layer. Furthermore, the sputtering yield is temperature-dependent because the sputtering energy increases with a rise in temperature. Sputtering of the trench mask can further be reduced by manipulating the temperature at which the dep-etch process occurs.

Figure 1:
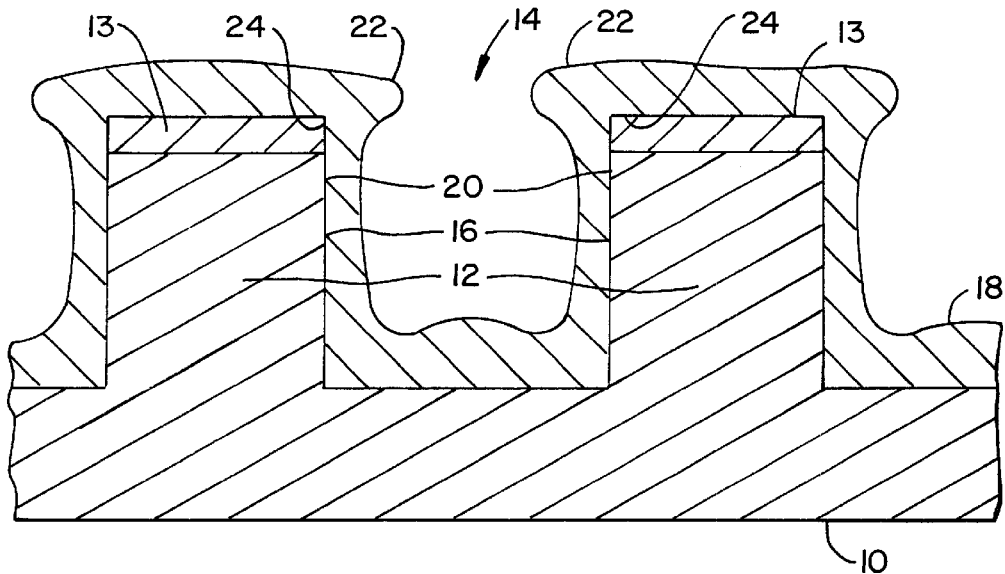
FIG. 1 is a vertical cross-sectional view of a substrate, demonstrating accumulation of dielectric material upon a shallow trench associated therewith, employing prior art deposition methods.
Figure 2:
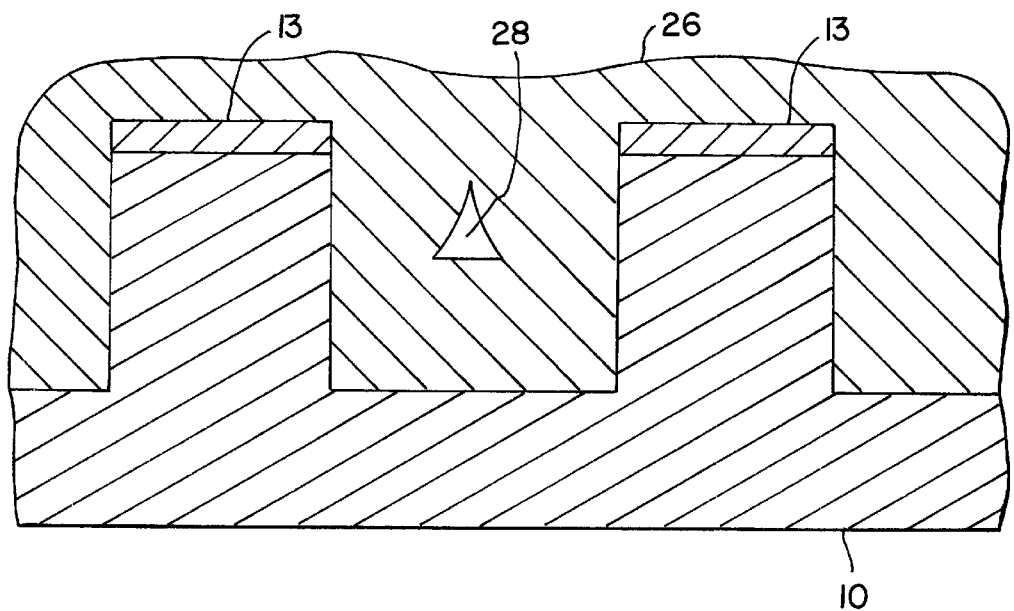
FIG. 2 is a vertical cross-sectional view of the substrate shown in FIG. 1, demonstrating an interior void associated with prior art deposition methods.
Figure 3:
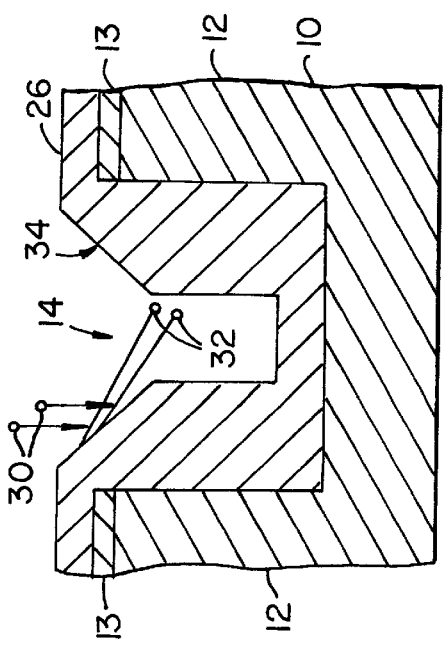
FIG. 3 is a vertical cross-sectional view of the substrate shown in FIGS. 1 and 2 in which a deposition-etch method is employed to remove the interior void shown in FIG. 2 in accordance with a prior art method.
Figure 4:
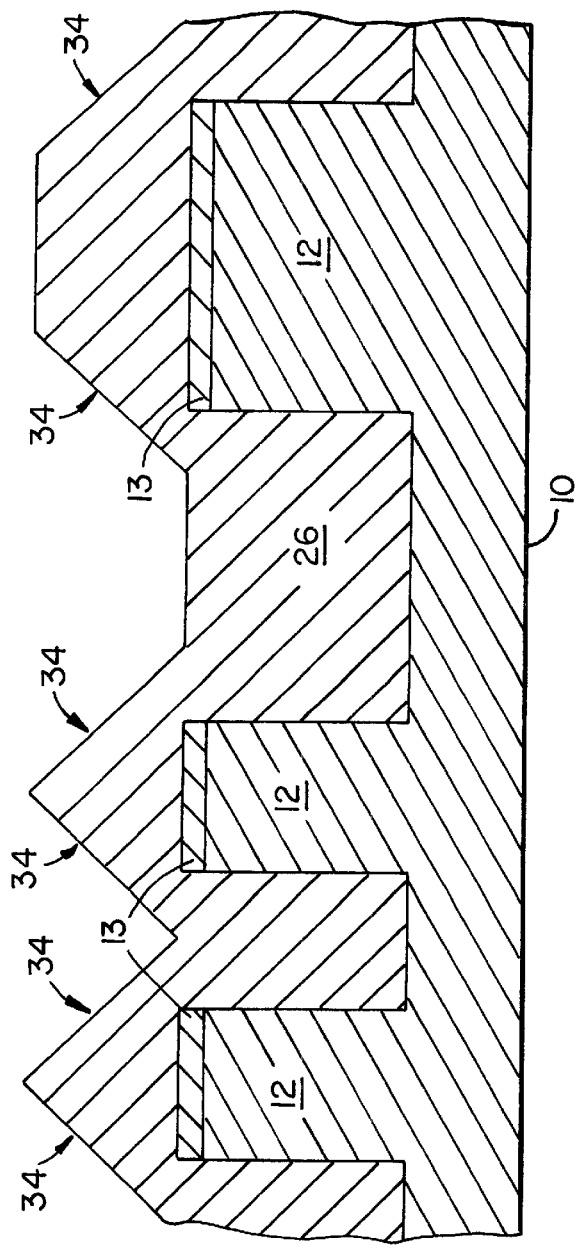
FIG. 4 is a vertical, cross-sectional view of the substrate shown in FIGS. 1, 2 and 3 demonstrating the contour of a dielectric layer disposed employing a prior art deposition etch method.
Figure 5:
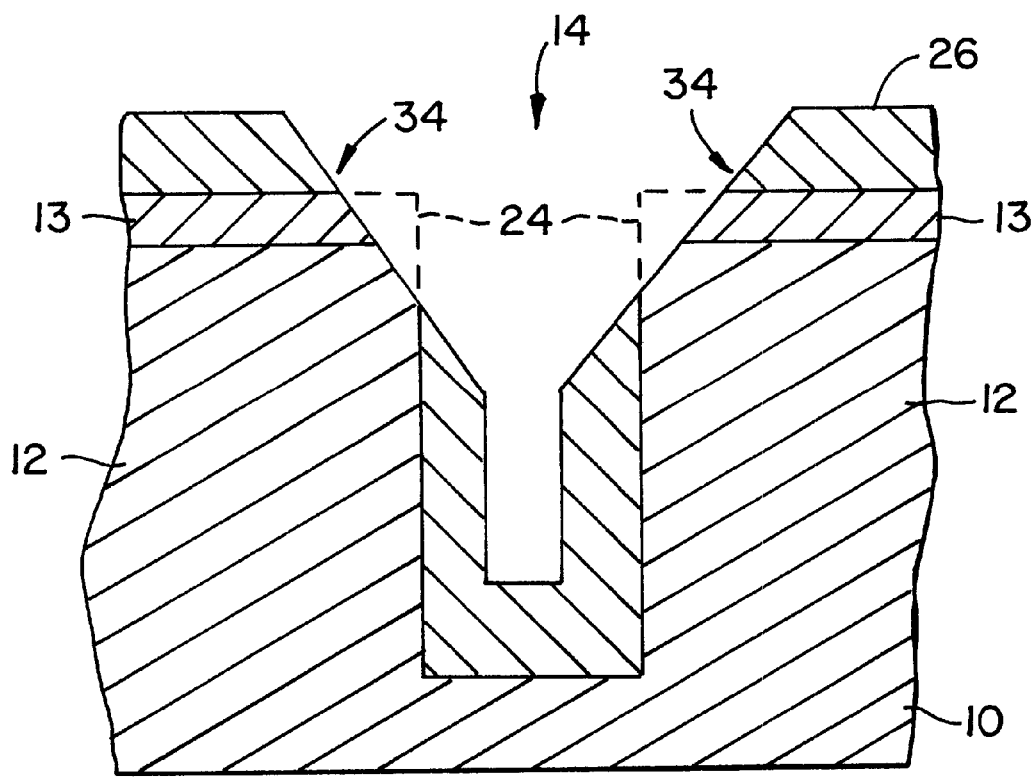
FIG. 5 is a vertical, cross-sectional view of a substrate, demonstrating the use of a deposition-etch method to fill with dielectric material a trench with a high aspect ratio associated therewith and the clipping of trench mask layer associated with the trench.
Figure 6:
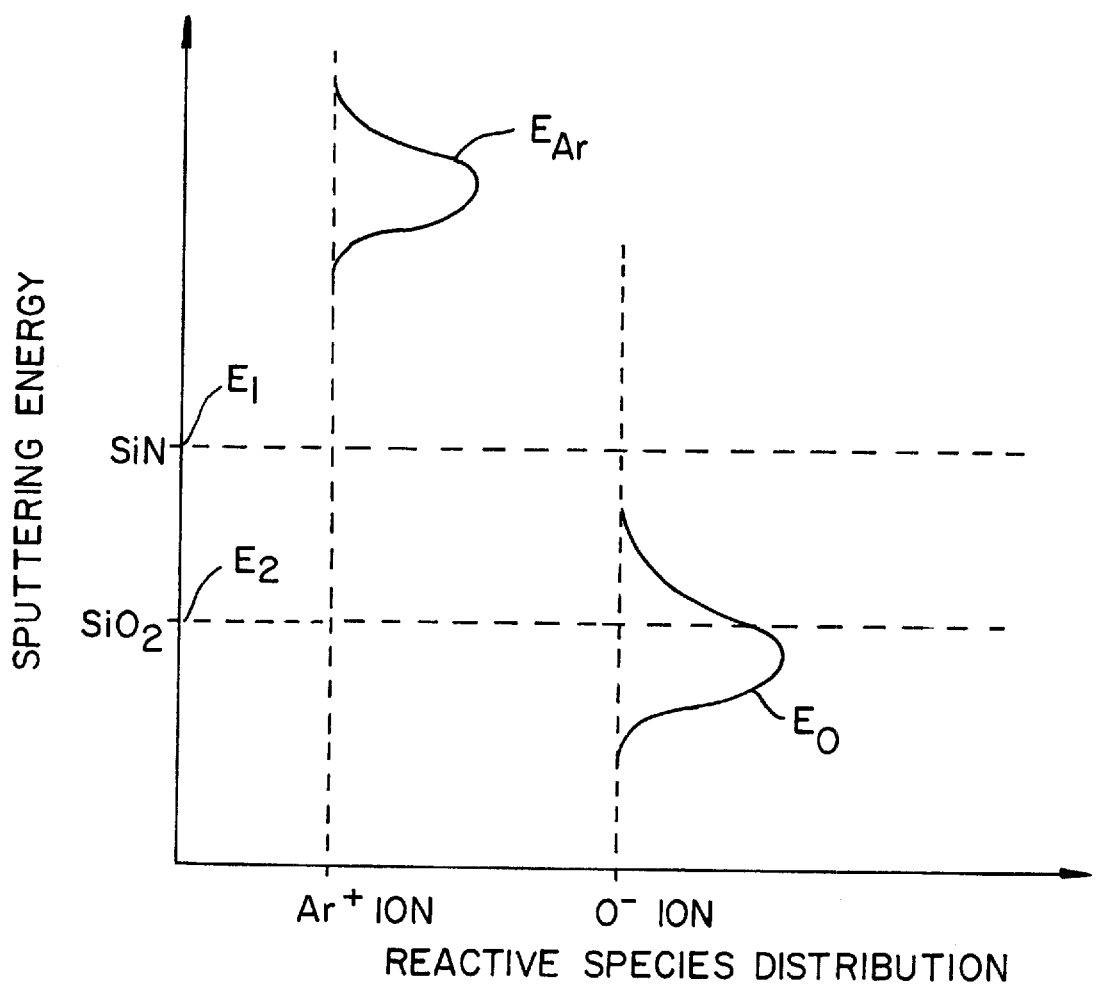
FIG. 6 is a schematic diagram comparing the sputtering energy for argon ions and oxygen ions.

In one embodiment, a dielectric layer formed from silicon dioxide is deposited on a shallow trench silicon substrate employing a standard HDP-CVD system. The substrate has a trench mask layer formed from silicon nitride, The deposition takes place in a process chamber in which a dep-etch gas mixture is flowed across the surface of the substrate. A typical dep-etch sputtering gas mixture includes a silicon source gas such as silane ($SiH_4$), an oxygen source gas such as molecular oxygen ($O_2$), and an inert gas such as argon (Ar). The gas mixture reacts chemically, and deposits the silicon dioxide dielectric layer and produces argon ions ($Ar^+$) and oxygen ions ($O^-$) for sputtering. As illustrated in FIG. 6, the sputtering energy distribution $E_{Ar}$ for argon ions is higher than the sputtering energy distribution $E_O$ for oxygen ions. FIG. 6 also shows that the silicon nitride mask requires a higher energy $E_1$ for sputtering than the silicon dioxide dielectric layer $E_2$. The argon ions have sufficient energy to sputter both silicon nitride and silicon dioxide. On the other hand, some of the oxygen ions have enough energy to sputter silicon dioxide, but may produce little or no sputtering of silicon nitride, By eliminating or significantly reducing the amount of argon in the dep-etch gas composition, it is possible to decrease the deposition-to-sputter ratio to fill the trench with little or no sputtering of the silicon nitride trench mask layer. The temperature can also be lowered early in the deposition so that even less sputtering of the silicon nitride mask occurs, since sputtering energy decreases with a drop in temperature. In this fashion, the deposition of the dielectric layer having superior gap-filling characteristics may be achieved for trenches having high aspect ratios without sacrificing the integrity of the trench mask layer.

Figure 7:
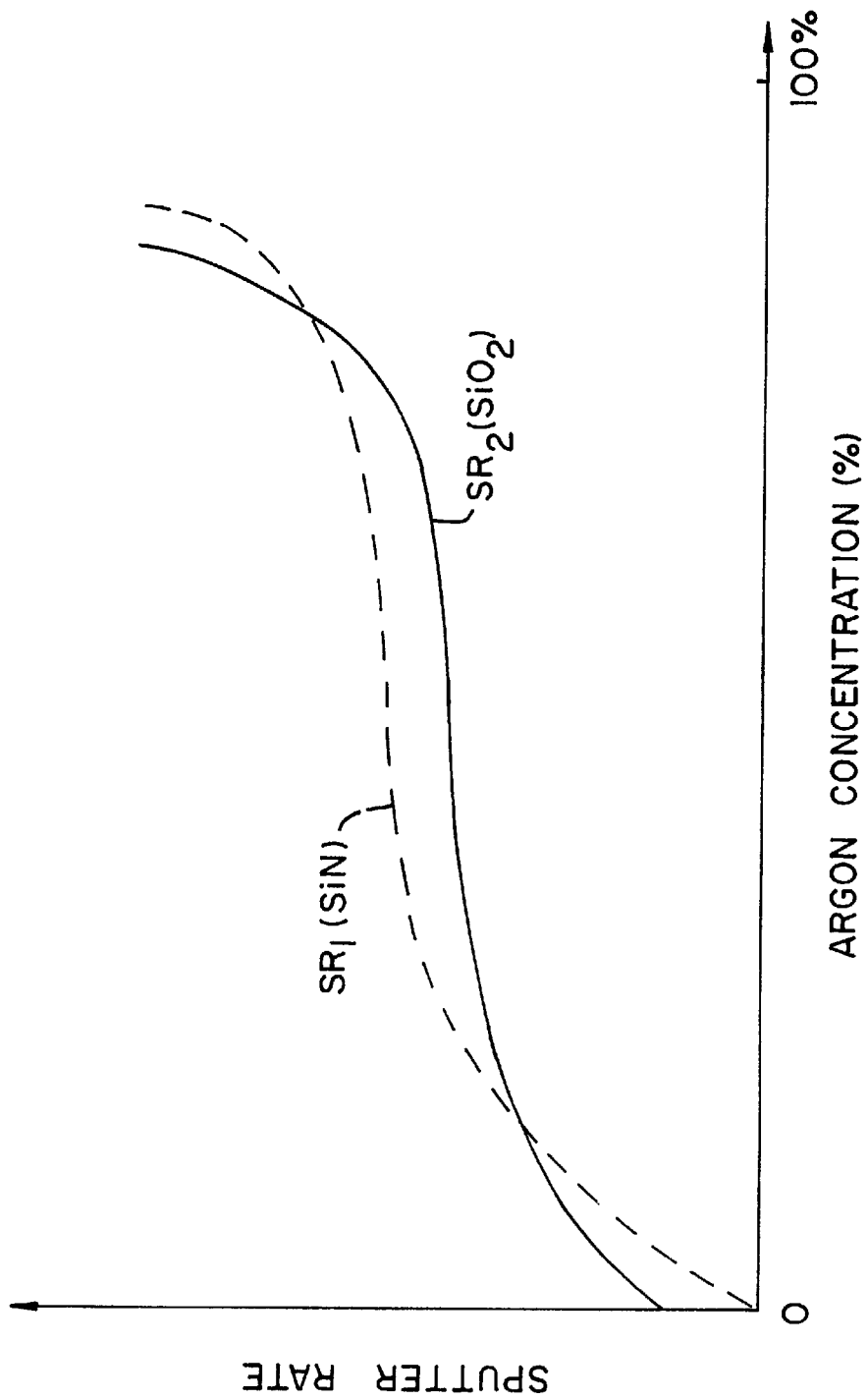
FIG. 7 is a schematic diagram illustrating variation of sputter rate with concentration of argon in the process gas mixture.

Because the elimination of argon lowers throughput, such a procedure is most desirable for filling very aggressive gaps having aspect ratios of about 3:1 or higher. For less aggressive gaps, it can be more advantageous to include in the process gas mixture a small percentage of argon to increase the overall deposition rate while still minimizing the sputtering of the silicon nitride mask. In that case, the percentage of argon is selected so that the sputter rate of the silicon nitride mask will be at an acceptable level in comparison with the sputter rate of the silicon dioxide dielectric layer. FIG. 7 schematically illustrates the variation of sputter rate of silicon nitride and silicon dioxide with concentration of argon in the process gas mixture. As shown by the curve $SR_1$, when argon is eliminated, the sputter rate of silicon nitride is virtually zero. The sputter rate of silicon dioxide is illustrated by the curve $SR_2$. At low argon concentration levels, the sputter rate for silicon dioxide is higher than that for silicon nitride due to sputtering by the oxygen ions. The sputter rate of silicon nitride exceeds that of silicon dioxide at higher argon concentration levels and for the bulk of the argon concentration range. The plot of FIG. 7 can be used to select an argon concentration level to yield the desired deposition result. It is also possible to vary the argon concentration throughout the dep-etch process. For instance, one may eliminate argon during the early stages of the trench-fill process and introduce argon at a later time after the depth of the trench has decreased and the possibility of clipping is reduced.

II. An Exemplary CVD System

Figure 8:
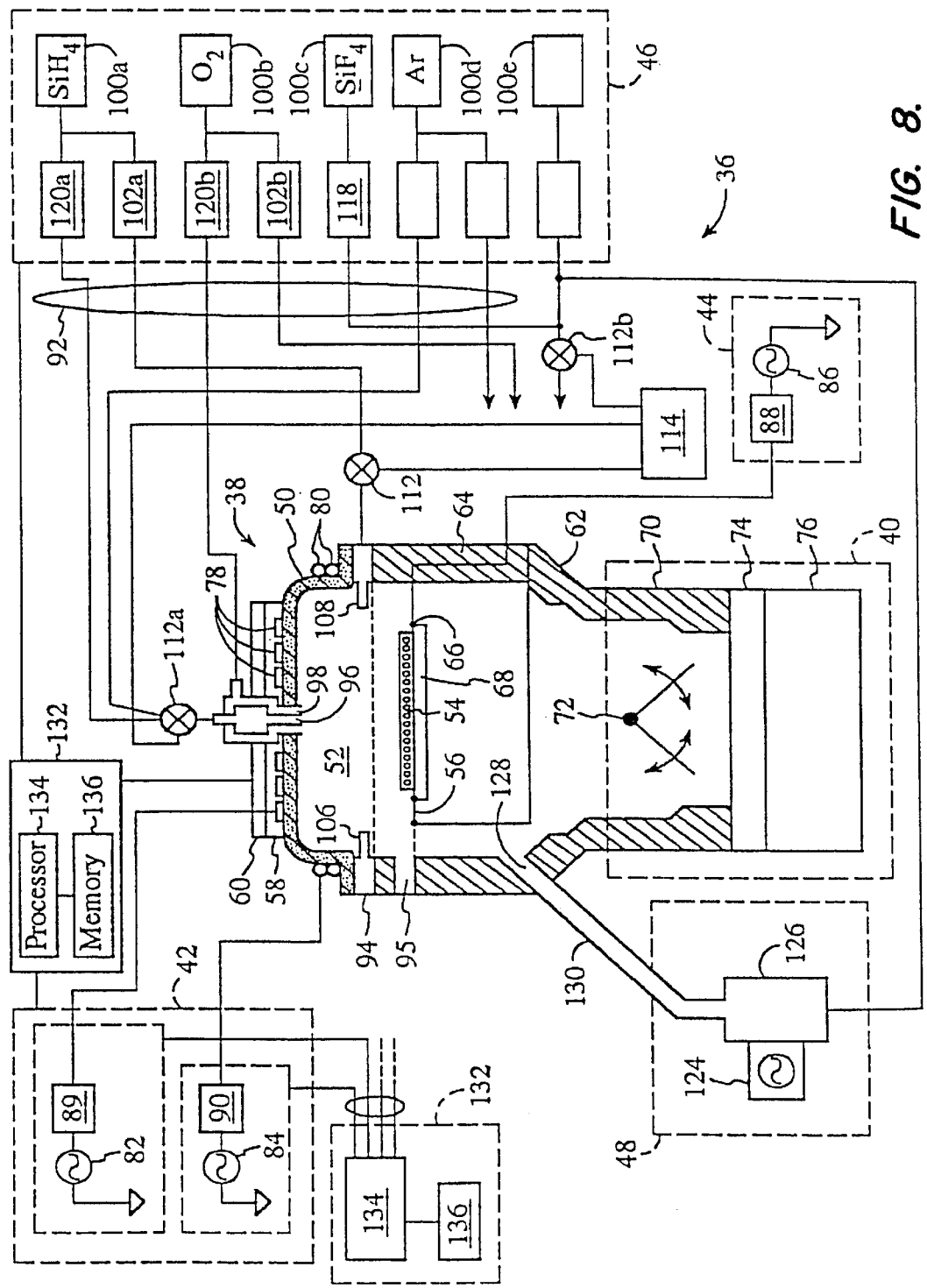
FIG. 8 is a simplified diagram of one embodiment of an HDP-CVD system according to the present invention.

FIG. 8 illustrates one embodiment of an HDP-CVD system 36, in which a dielectric layer according to the present invention can be deposited. The system 36 includes a process chamber 38, a vacuum system 40, a source plasma system 42, a bias plasma system 44, a gas delivery system 46, and a remote plasma cleaning system 48.

An upper portion of process chamber 38 includes a dome 50, which is made of a dielectric material, such as alumina or aluminum nitride. The dome 50 defines an upper boundary of a plasma processing region 52. The plasma processing region 52 is bounded on the bottom by the upper surface of substrate 54 and the substrate support member 56.

A heater plate 58 and a cold plate 60 surmount, and are thermally coupled to, the dome 50. The heater plate 58 and the cold plate 60 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the process chamber and improves adhesion between the deposited layer and the substrate.

The lower portion of process chamber 38 includes a body member 62, which joins the process chamber to the vacuum system. A base portion 64 of the substrate support member 56 is mounted on, and forms a continuous inner surface with, body member 62. Substrates are transferred into and out of process chamber 38 by a robot blade (not shown) through an insertion/removal opening 95 in the side of process chamber 38. A motor (not shown) raises and lowers a lift-pin plate (not shown) that raises and lowers lift pins (not shown) that raise and lower the wafer. Upon transfer into process chamber 38, substrates are loaded onto the raised lift pins, and then lowered to a substrate receiving portion 66 of substrate support member 56. Substrate receiving portion 66 includes an electrostatic chuck 68 that secures the substrate to substrate support member 56 during substrate processing.

The vacuum system 40 includes a throttle body 70, which houses twin-blade throttle valve 72 and is attached to gate valve 74 and turbomolecular pump 76. It should be noted that throttle body 70 offers minimum obstruction to gas flow, and allows symmetric pumping, as described in, co-assigned U.S. patent application, originally filed on filed Dec. 12, 1995, and assigned Ser. No. 08/574,839, refiled on Sep. 11, 1996 and assigned Ser. No. 08/712724 entitled "SYMTRC CHAMBER". The gate valve 74 can isolate the pump 76 from the throttle body 70, and can also control process chamber pressure by restricting the exhaust flow capacity when throttle valve 72 is fully open. The arrangement of the throttle valve 72, gate valve 74, and turbo molecular pump 76 allow accurate and stable control of process chamber pressures from about 1 to 100 millitorr.

The source plasma system 42 includes a top coil 78 and side coil 80, mounted on dome 50. A symmetrical ground shield (not shown) reduces electrical coupling between the coils. Top coil 78 is powered by top RF source generator 82, while the side coil 80 is powered by side RF source generator 84, allowing independent power levels and frequencies of operation for each coil. This dual coil system allows control of the radial ion density in process chamber 38, thereby improving plasma uniformity. Side coil 80 and top coil 78 couple energy into the chamber 38 inductively. In a specific embodiment, the top RF source generator 82 provides up to about 5300 Watts or higher of RF power at nominally 2 MHz and the side RF source generator 84 provides up to about 2300 Watts or higher of RF power at nominally 2 MHz. The operating frequencies of the top and side RF generators may be offset from the nominal operating frequency (e.g., to 1.7–1.9 MHz and 1.9–2.1 MHz, respectively) to improve plasma-generation efficiency.

The RF generators 82 and 84 include digitally controlled synthesizers and operate over a frequency range from about 1.7 to about 2.1 MHz. Each generator includes an RF control circuit (not shown) that measures reflected power from the process chamber and coil back to the generator, and adjusts the frequency of operation to obtain the lowest reflected power, as understood by a person of ordinary skill in the art. RF generators are typically designed to operate into a load with a characteristic impedance of 50 Ω. RF power may be reflected from loads that have a different characteristic impedance than the generator. This can reduce power transferred to the load. Additionally, power reflected from the load back to the generator may overload and damage the generator. Because the impedance of a plasma may range from less than 5 Ω to over 900 Ω, depending on the plasma ion density among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 89 and 90 match the output impedance of generators 82 and 84 with coils 78 and 80, respectively. The RF control circuit may tune both matching networks by changing the value of capacitors within the matching networks to match the generator to the load as the load changes. The RF control circuit may tune, a matching network when the power reflected from the load back to the generator exceeds a certain limit, One way to provide a constant match, and effectively disable the RF control circuit from tuning the matching network, is to set the reflected power limit above any expected value of reflected power. This may help stabilize a plasma under some conditions by holding the matching network constant at its most recent condition.

The bias plasma system 44 includes an RF bias generator 86 and a bias matching network 88. The bias plasma system 44 capacitively couples substrate receiving portion 66 to the body member 62, which act as complementary electrodes. The bias plasma system 44 serves to enhance the transport of plasma species created by the source plasma system 42 to the surface of the substrate. In a specific embodiment, the RF bias generator 86 provides up to 5000 Watts of RF power at 13.56 MHz.

Other measures may also help stabilize a plasma. For example, the RF control circuit can be used to determine the power delivered to the load (plasma) and may increase or decrease the generator output power to keep the delivered power substantially constant during deposition of a layer.

Figure 9:
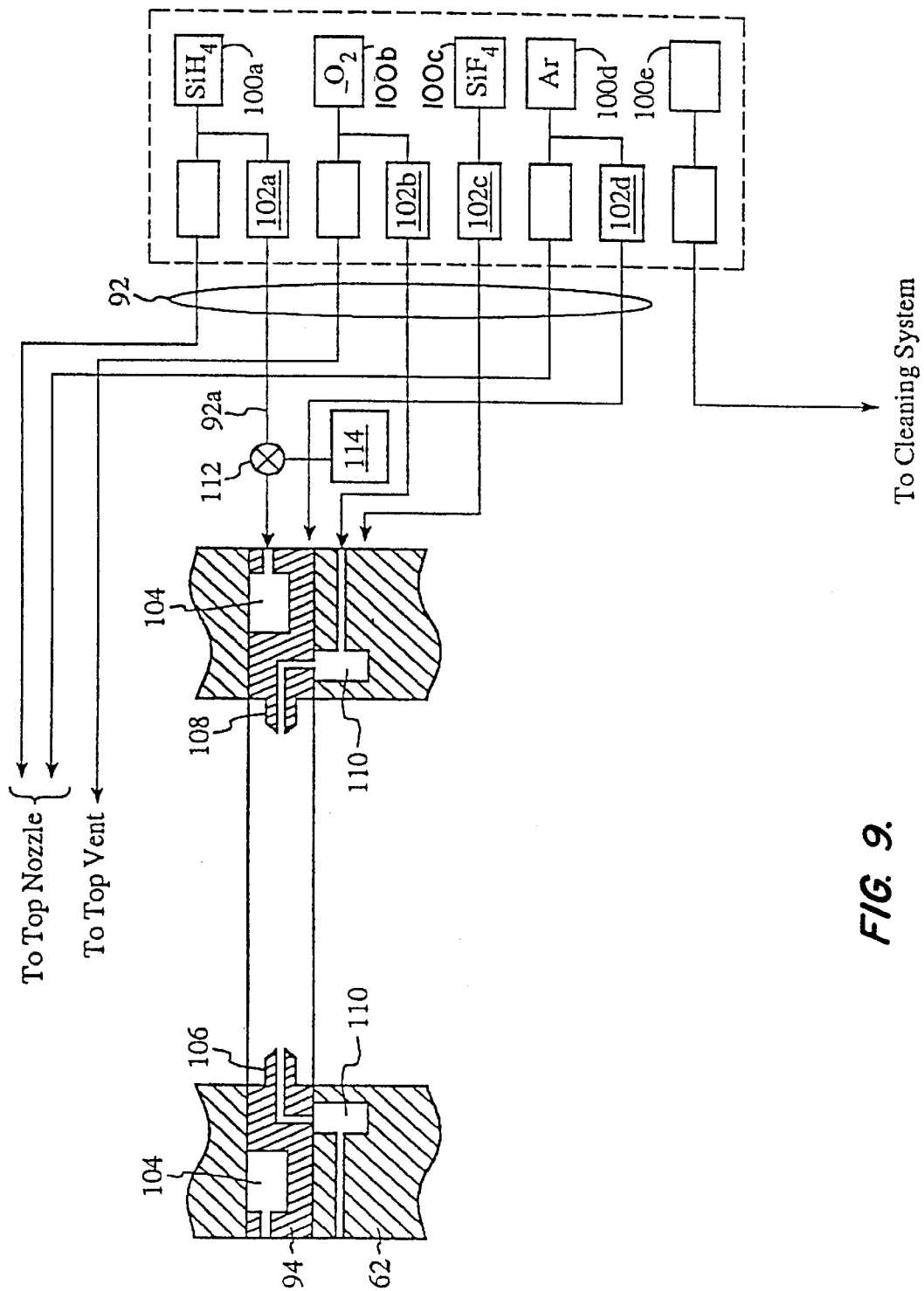
FIG. 9 is a simplified cross-section of a gas ring that may be used in conjunction with the exemplary CVD process chamber of FIG. 8.

The gas delivery system 46 provides gases from several sources to the process chamber for processing the substrate via gas delivery lines 92 (only some of which are shown). Gases are introduced into the process chamber 38 through a gas ring 94, a top nozzle 96, and a top vent 98, Referring to FIGS. 8 and 9, first and second gas sources, 100a and 100b, and first and second gas flow controllers, 102a and 102b, provide gas to ring plenum 104 in gas ring 94 via gas delivery lines 92 (only some of which are shown). Gas ring 94 has a plurality of gas nozzles 106 and 108 (only two of which is shown) that provide a uniform flow of gas over the substrate, Nozzle length and nozzle angle may be changed by changing gas ring 94. This allows tailoring the uniformity profile and gas utilization efficiency for a particular process within an individual process chamber. In a specific embodiment, the gas ring 94 has a total of twenty-four gas nozzles, twelve first gas nozzles 108 and twelve second gas nozzles 106.

Gas ring 94 has a plurality of first gas nozzles 108 (only one of which is shown), which in a preferred embodiment are coplanar with, and shorter than, a plurality of second gas nozzles 106. In one embodiment, first gas nozzles 108 receive one or more gases from body plenum 110, and second gas nozzles 106 receive one or more gases from gas ring plenum 104. In some embodiments, it is desirable not to mix gases in the body plenum 110 and the gas ring plenum 104 before injecting the gases into the process chamber 38, such as when the first gas nozzles are used to deliver oxidizer gas and the second gas nozzles are used to deliver source gas. In other embodiments, process gases may be mixed prior to injecting the gases into the process chamber 38 by providing apertures (not shown) between body plenum 110 and gas ring plenum 104. In one embodiment, third and fourth gas sources, 100c and 100d, and third and fourth gas flow controllers, 102c and 102d, provide gas to body plenum via gas delivery lines 92. Additional valves, such as 112 (other valves not shown), may shut off gas from the flow controllers to the process chamber.

In some embodiments, flammable, toxic, or corrosive gases, such as silane or nitrogen trifluoride, may be used. In these instances, it may be desirable to eliminate gas remaining in the gas delivery lines after a deposition. This may be accomplished using a three-way valve, such as valve 112, to isolate process chamber 38 from delivery line 92a, and to vent delivery line 92a to vacuum foreline 114, for example. As shown in FIG. 8, other similar valves, such as 112A and 112B, may be incorporated on other gas delivery lines. Such three-way valves may be placed as close to process chamber 38 as practical, to minimize the volume of the unvented gas delivery line (between the three-way valve and the process chamber). Additionally, two-way (on-off) valves (not shown) may be placed between a mass flow controller (MFC) and the process chamber or between a gas source and an MFC.

Referring again to FIG. 8, the top nozzle 96 and top vent 98 allow independent control of top and side flows of the gases, which improves film uniformity and allows fine adjustment of the film's deposition and doping parameters, The top vent 98 is an annular opening around the top nozzle 96 through which gas may flow into the process chamber from the gas delivery system. In one embodiment, the first gas source 100a is a silane source that supplies gas nozzles 106 and top nozzle 96, Source nozzle MFC 102a controls the amount of silane delivered to gas nozzles 106 and top nozzle MFC 120a controls the amount of silane delivered to top gas nozzle 96. Similarly, two MFCs 102b and 120b may be used to control the flow of oxygen to both top vent 98 and first gas nozzles 108 from a single source of oxygen, such as source 100b. The gases supplied to top nozzle 96 and top vent 98 may be kept separate prior to flowing the gases into process chamber 38, or the gases may be mixed in top plenum 112a before they flow into process chamber 38. Separate sources of the same gas may be used to supply various portions of the process chamber.

The remote microwave generated plasma cleaning system 48 is provided to periodically clean deposition residues from process chamber components. The cleaning system includes a remote microwave generator 124 that creates a plasma from a cleaning gas source 100e, such as fluorine, nitrogen trifluoride, or equivalents, in reactor cavity 126. The reactive species resulting from this plasma are conveyed to process chamber 38 through claw gas feed port 128 via applicator tube 130. The materials used to contain the cleaning plasma (e.g., cavity 126 and applicator tube 130) should be resistant to attack by the plasma. The distance between reactor cavity 126 and feed port 128 should be kept as short as practical, as the concentration of desirable plasma species may decline with distance from reactor cavity 126. Generating the cleaning plasma in a remote cavity allows the use of an efficient microwave generator and does not subject process chamber components to the temperature, radiation, or bombardment of the glow discharge that may be present in an in situ plasma. Consequently, relatively sensitive components, such as the electrostatic chuck 68, do not need to be covered with a dummy wafer or otherwise protected, as may be required with an in situ plasma cleaning process. During the cleaning process, or other processes, the gate valve 74 may be closed to isolate the turbomolecular vacuum pump 76 from the process chamber. In this configuration, the foreline 114 provides a process vacuum generated by remote vacuum pumps, which are typically mechanical vacuum pumps. Isolating the turbomolecular pump from the process chamber with the gate valve protects the turbomolecular pump from corrosive compounds or other potentially harmful effects resulting from the process chamber clean or other processes.

A system controller 132 regulates the operation of system 36 and includes a processor 134 in electrical communication therewith to regulate the operations thereof. Typically, the processor 134 is part of a single-board computer (SBC), that includes analog and digital input/output boards, interface boards and stepper motor controller boards. Various components of the CVD system 36 conform to the Versa Modular European (VME) standard, which defines board, card cage, as well as connector type and dimensions. The VME standard also defines the bus structure as having a 16-bit data bus and a 24-bit address bus. The processor 134 executes system control software, which is a computer program stored in a memory 136, electronically coupled to the processor 134. Any type of memory device may be employed, such as a hard disk drive, a floppy disk drive, a card rack or a combination thereof, The system control software includes sets of instructions that dictate the timing, mixture of gases, process chamber pressure, process chamber temperature, microwave power levels, pedestal position, and other parameters of a particular process, discussed more fully below with respect to FIG. 11.

Figure 10:
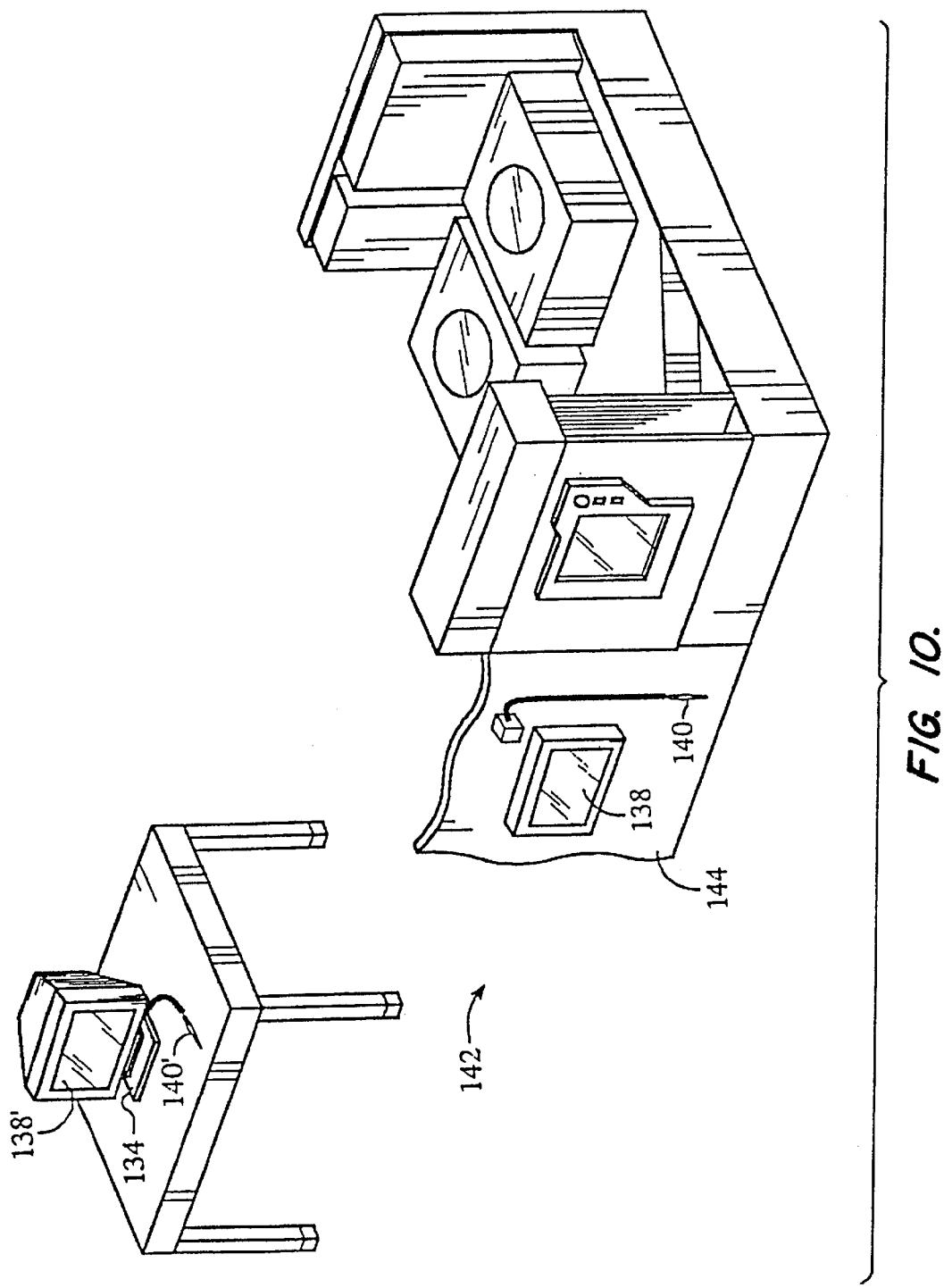
FIG. 10 is a simplified diagram of a monitor and light pen that may be used in conjunction with the exemplary CVD process chamber of FIG. 8.

Referring to FIG. 10, the interface between a user and the processor 134 is via a CRT monitor 138 and light pen 140 In the preferred embodiment two monitors 138 and 138' are used, each having a light pen associated therewith, 140 and 140', respectively. One of the monitors 138 is mounted in a clean room wall 144 for the operators and the other behind the wall for the service technicians. The CRT monitors 138 and 138' may simultaneously display the same information, but only one of the light pens 140 and 140' is enabled for data input during any given time. Were light pen 140 employed to communicate with the processor 134, an operator would place the same on the screen of the CRT monitor 138. A light sensor (not shown) located at the tip of the light pen 140 detects light emitted by the CRT monitor 138. To select a particular screen or function, the operator touches a designated area of the CRT monitor 138 and pushes a button (not shown) on the light pen 140. The touched area provides a visual response, such as a change in color, or a new menu or screen being displayed, confirming communication between the light pen 140 and the CRT monitor 138. Other input devices, such as a keyboard, mouse, or other pointing or communication device, may be used instead of or in addition to the light pen 140 to allow the user to communicate with the processor 134.

The process for depositing the film can be implemented using a computer program product that is executed by the processor 134. The computer program code can be written in any conventional computer readable programming language, for example, 68000 assembly language, C, C++, Pascal, Fortran or others. Suitable program code is entered into a single file, or multiple files, using a conventional text editor, and stored or embodied in a computer usable medium, such as the memory 136, shown in FIG. 8. If the entered code text is in a high level language, the code is compiled, and the resultant compiler code is then linked with an object code of precompiled Windows™ library routines. To execute the linked, compiled object code the system user invokes the object code, causing the processor 134 to load the code in the memory 136. The processor 134 then reads and executes the code to perform the tasks identified in the program.

Figure 11:
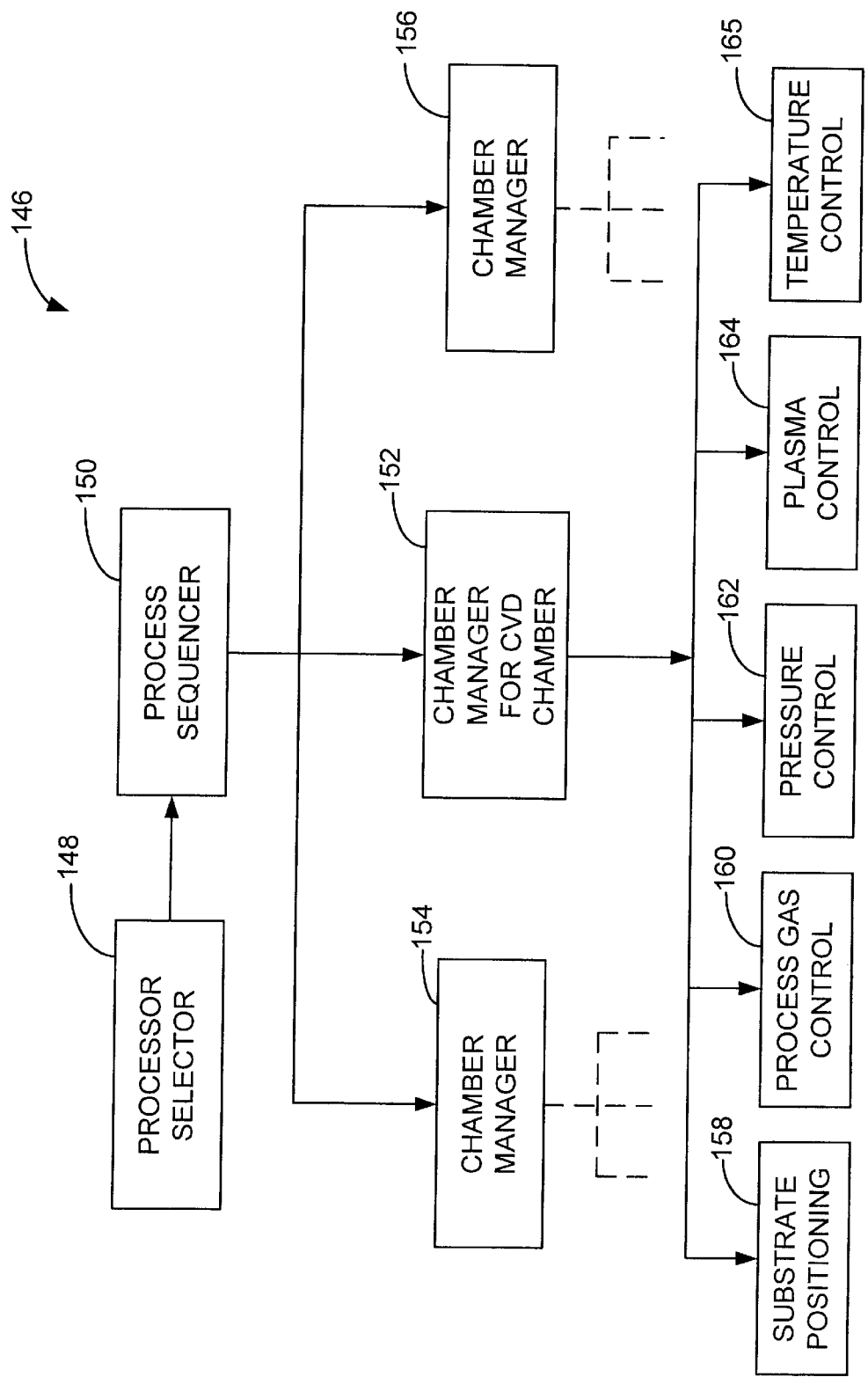
FIG. 11 is a flow chart of an exemplary process control computer program product used to control the exemplary CVD process chamber of FIG. 8.

FIG. 11 shows an illustrative block diagram of the hierarchical control structure of system control software 146. A user enters a process set number and process chamber number into a process selector subroutine 148 in response to menus or screens displayed on the CRT monitor by using the light pen interface. The process sets are predetermined sets of process parameters necessary to carry out specified processes, and are identified by predefined set numbers. Process selector subroutine 148 identifies (i) the desired process chamber in a multichamber system, and (ii) the desired set of process parameters needed to operate the process chamber for performing the desired process. The process parameters for performing a specific process relate to process conditions such as, for example, process gas composition and flow rates, temperature, pressure, plasma conditions such as RF power levels, and process chamber dome temperature, and are provided to the user in the form of a recipe. The parameters specified by the recipe are entered utilizing the light pen/CRT monitor interface.

The signals for monitoring the process are provided by the analog input and digital input boards of the system controller and the signals for controlling the process are output on the analog output and digital output boards of the system controller.

A process sequencer subroutine 150 comprises program code for accepting the identified process chamber and set of process parameters from the process selector subroutine 148, and for controlling operation of the various process chambers, Multiple users can enter process set numbers and process chamber numbers, or a user can enter multiple process set numbers and process chamber numbers, so sequencer subroutine 150 operates to schedule the selected processes in the desired sequence. Preferably, sequencer subroutine 150 includes a program code to perform the steps of (i) monitoring the operation of the process chambers to determine if the process chambers are being used, (ii) determining what processes are being carried out in the process chambers being used, and (iii) executing the desired process based on availability of a process chamber and type of process to be carried out. Conventional methods of monitoring the process chambers can be used, such as polling. When scheduling which process is to be executed, sequencer subroutine 150 can be designed to take into consideration the present condition of the process chamber being used in comparison with the desired process conditions for a selected process, or the "age" of each particular user entered request, or any other relevant factor a system programmer desires to include for determining scheduling priorities.

After sequencer subroutine 150 determines which process chamber and process set combination is going to be executed next, sequencer subroutine 150 causes execution of the process set by passing the particular process set parameters to process chamber manager subroutines 152, 154 and 156, which control multiple processing tasks in process chamber 38 and possibly other process chambers (not shown) according to the process set detemined by sequencer subroutine 150.

Examples of process chamber component subroutines are substrate positioning subroutine 158, process gas control subroutine 160, pressure control subroutine 162, plasma control subroutine 164, and temperature control subroutine 165. Those having ordinary skill in the art will recognize that other process chamber control subroutines can be included depending on what processes are desired to be performed in process chamber 38. In operation, process chamber manager subroutine 152 selectively schedules or calls the process component subroutines in accordance with the particular process set being executed. Scheduling by process chamber manager subroutine 152 is performed in a manner similar to that used by sequencer subroutine 150 in scheduling which process chamber and process set to execute. Typically, process chamber manager subroutine 152 includes steps of monitoring the various process chamber components, determining which components need to be operated based on the process parameters for the process set to be executed, and causing execution of a process chamber component subroutine responsive to the monitoring and determining steps.

Referring to both FIGS. 8 and 11, in operation the substrate positioning subroutine 158 (FIG. 11) comprises program code for controlling process chamber components that are used to load the substrate 54 onto substrate support number 68 (FIG. 8). The substrate positioning subroutine 158 may also control transfer of a substrate into process chamber 38 from, e.g., a PECVD reactor or other reactor in the multichamber system, after other processing has been completed The process gas control subroutine 160 has program code for controlling process gas composition and flow rates. Subroutine 160 controls the open/close position of the safety shut-off valves, and also ramps up/down the mass flow controllers to obtain the desired gas flow rates. All process chamber component subroutines, including process gas control subroutine 160, arc invoked by process chamber manager subroutine 152. Subroutine 160 receives process parameters from process chamber manager subroutine 152 related to the desired gas flow rates.

Typically, process gas control subroutine 160 operates by opening the gas supply lines, and repeatedly (i) reading the necessary mass flow controllers, (ii) comparing the readings to the desired flow rates received from process chamber manager subroutine 152, and (iii) adjusting the flow rates of the gas supply lines as necessary. Furthermore, process gas control subroutine 160 may include steps for monitoring the gas flow rates for unsafe rates, and activating the safety shut-off valves when an unsafe condition is detected.

In some processes, an inert gas is flowed into process chamber 13 to stabilize the pressure in the process chamber before reactive process gases are introduced into the process chamber. For these processes, the process gas control subroutine 160 is programmed to include steps for flowing the inert gas into process chamber 38 for an amount of time necessary to stabilize the pressure in the process chamber. The above-described steps may then be carried out.

Additionally, when a process gas is to be vaporized from a liquid precursor, for example, tetraethyloxysilane (TEOS), the process gas control subroutine 160 may include steps for bubbling a delivery gas such as helium through the liquid precursor in a bubbler assembly or for introducing the helium to a liquid injection valve. For this type of process, the process gas control subroutine 160 regulates the flow of the delivery gas, the pressure in the bubbler, and the bubbler temperature to obtain the desired process gas flow rates. As discussed above, the desired process gas flow rates are transferred to process gas control subroutine 160 as process parameters.

Furthermore, the process gas control subroutine 160 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared with the necessary values and adjusted accordingly.

The process gas control subroutine 160 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 162 includes program code for controlling, the pressure in process chamber 38 by regulating the size of the opening of throttle valve 72 in the exhaust portion of the process chamber. There are at least two basic methods Of controlling the process chamber with the throttle valve. The first method relies on character the process chamber pressure as it relates to, among other things, the total process gas flow, size of the process chamber, and pumping capacity. The first method sets throttle valve 72 to a fixed position. Setting throttle valve 72 to a fixed position may eventually result in a steady-state pressure.

Alternatively, the process chamber pressure may be measured with a manometer, for example, and throttle valve 72 position may be adjusted according to pressure control subroutine 162, assuming the control point is within the boundaries set by gas flows and exhaust capacity. The former method may result in quicker process chamber pressure changes, as the measurements, comparisons, and calculations associated with the latter method are not invoked. The former method may be desirable when precise control of the process chamber pressure is not required, whereas the latter method may be desirable when an accurate, repeatable, and stable pressure is desired, such as during the deposition of a layer.

When pressure control subroutine 162 is invoked, the desired (or target) pressure level is received as a parameter from process chamber manager subroutine 152. Pressure control subroutine 162 operates to measure the pressure in process chamber 38 by reading one or more conventional pressure manometers connected to the process chamber, compare the measure value(s) with the target pressure, obtain proportional, integral, and differential (PID) values from a stored pressure table corresponding to the target pressure, and adjust throttle valve 72 according to the PID values obtained from the pressure table. Alternatively, pressure control subroutine 162 may open or close throttle valve 72 to a particular opening size to regulate the pressure in process chamber 38 to a desired pressure or pressure range.

The plasma control subroutine 164 comprises program code for controlling the frequency and power output setting of RF generators 82 and 84, and for tuning matching networks 88 and 90, The temperature control subroutine 165 comprises program code for controlling the temperature inside the process chamber 38. Plasma control subroutine 164 and temperature control subroutine 165, like the previously described process chamber component subroutines, are invoked by process chamber manager subroutine 152.

An example of a system which may incorporate some or all of the subsystems and routines described above would be an Ultima System, manufactured by Applied Materials, configured to practice the present invention.

III. Exemplary Structure

Figure 12:
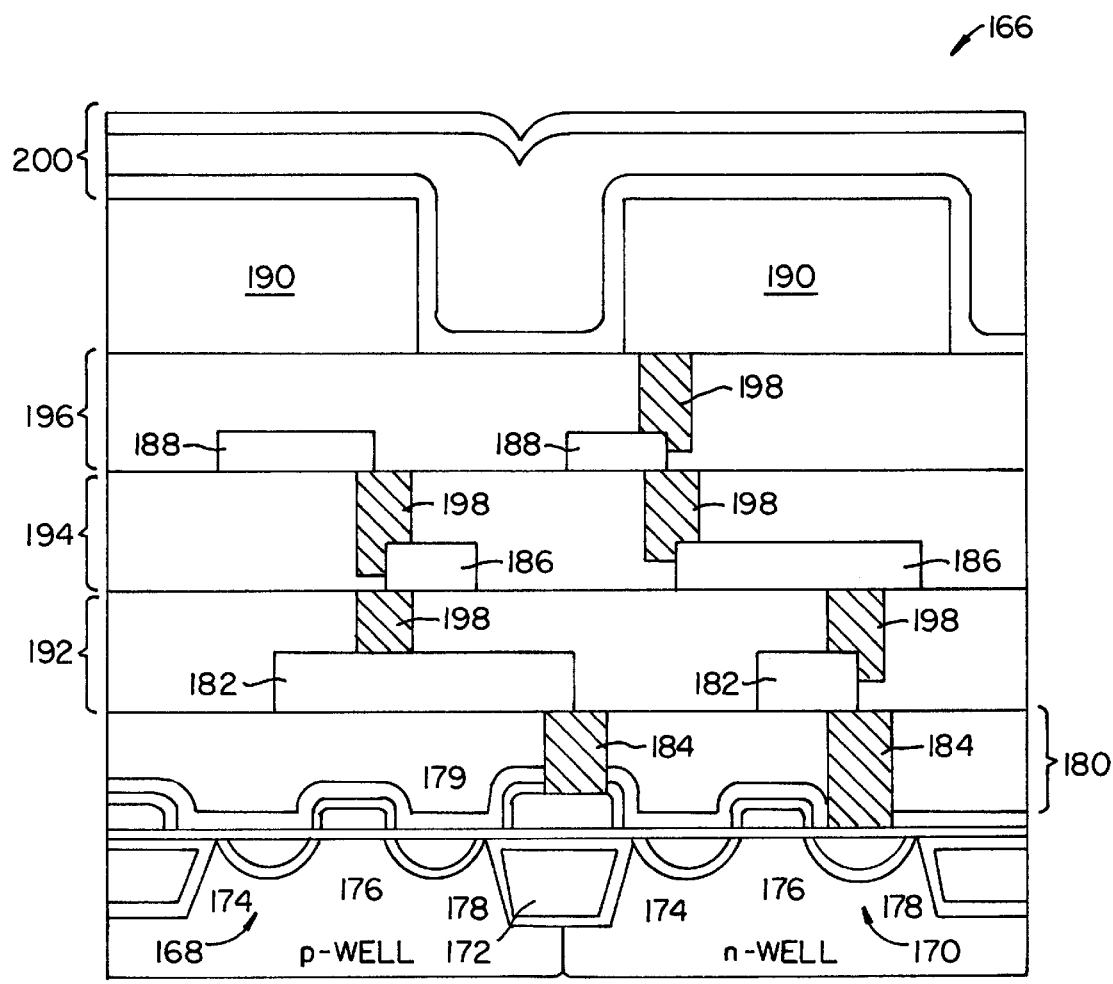
FIG. 12 is a cross-sectional view of an integrated circuit formed employing the present invention.

FIG. 12 illustrates a simplified cross-sectional view of an integrated circuit 166 incorporating features of the present invention. As shown in FIG. 12, integrated circuit 166 includes NMOS and PMOS transistors 168 and 170, which are separated and electrically isolated from each other by a shallow trench 172. Each transistor 168 and 170 comprises a source region 174, a gate region 176, and a drain region 178. A field oxide region 179 is formed above the shallow trench 172, source region 174, and drain region 178.

A premetal dielectric layer 180 separates transistors 168 and 170 from a metal layer 182, with connections between metal layer 182 and the transistors made by contacts 184. The metal layer 182 is one of four metal layers, 182, 186, 188 and 190, included in integrated circuit 166, Each metal layer 182, 186, 188 and 190 is separated from adjacent metal layers by respective intermetal dielectric layers 192, 194 and 196, and may be formed by processing steps such as aluminum deposition and paling, Adjacent metal layers are connected at selected openings by vias 198. Deposited over metal layer 190 are planarized passivation layers 200.

The simplified integrated circuit 166 is for illustrative purposes only. One of ordinary skill in the art could implement the present method for fabrication of other integrated circuits such as microprocessors, application-specific integrated circuits (ASICs), memory devices, and the like. Additionally, the method of the present invention may be used in the fabrication of integrated circuits using other technologies such as BiCMOS, NMOS, bipolar and others.

IV. In-Situ Deposition-Etch

Figure 13:
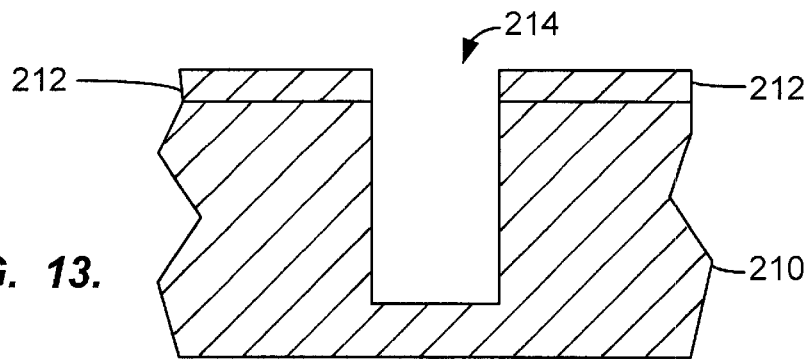
FIG. 13 is a cross-sectional view of a substrate with a gap.
Figure 14:
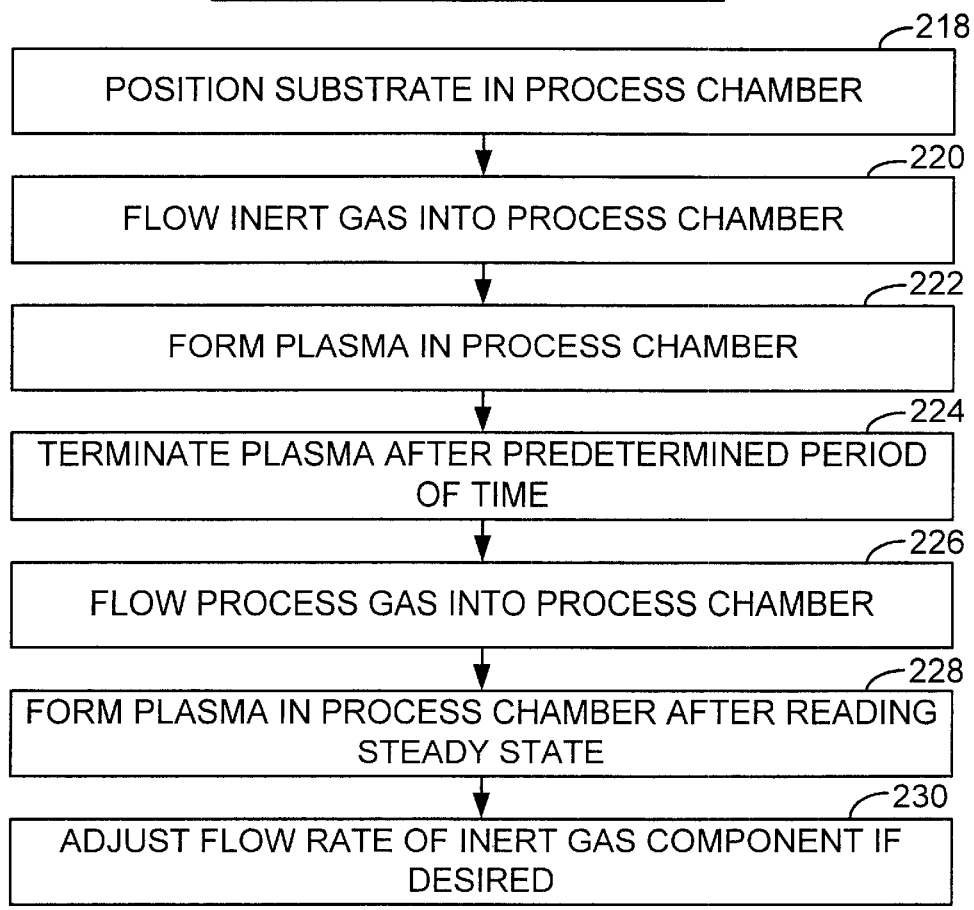
FIG. 14 is a flow diagram of the method in accord with an embodiment of the present invention.

Referring to both FIGS. 8, 13, and 14, the method of the present invention may be employed to deposit a gap-fill layer on the substrate 210 (FIG. 13) having a trench mask 212 positioned in the HDP-CVD system (FIG. 8) to fill a trench 214. The trench 214 is typically a shallow trench with an aspect ratio of about 3:1 or more and a depth of about 1 $\mu$m or less, with the aspect ratio being defined as the depth of the trench 214, H, divided by its width W. The method includes a step 218 (FIG. 14) during which the substrate 210 is positioned in the process chamber 38 proximate to the plasma processing region 52. Subsequent to step 218, an inert gas is flowed into the process chamber 38, during step 220, as shown in FIG. 14. The aforementioned inert gas typically comprises a flow of argon gas, Ar. Examples of other suitable inert or non-reactive gases include helium and hydrogen. After the inert gas is introduced into the process chamber 38, a plasma is struck at step 222. The plasma from the inert gas heats the substrate 210. When the substrate 210 reaches a predetermined temperature, which is typically the temperature at which deposition of the trench-fill layer is to take place, the plasma is terminated (step 224).

Following step 224, a deposition gas is introduced into the process chamber 38 without plasma excitation, at step 226. The deposition gas includes, for example, a silicon source gas, such as silane gas, $SiH_4$, and an oxygen source gas, such as molecular oxygen gas, $O_2$. During step 226, the flow rate of argon is preferably substantially lower than the flow rates of the silicon and oxygen source gases. In one example, the argon flow rate is in the range of about 0–40 sccm. The flow rate of the silane gas is in the range of about 60–70 sccm, and the oxygen gas is flowed into the process chamber at a flow rate in the range of about 120–140 sccm.

A plasma is formed at step 228 by the RF source generators 82 and 84 and the RF bias generator 86 creating an RF field in the plasma processing region 52 (FIG. 8). The RF bias generator 86 typically has a frequency of about 13.56 MHz and a power level of about 2000–3500 Watts. The RF source generators 82 and 84 typically employ a frequency of about 2 MHz. For a 200-mm substrate having a substrate area of 314 $cm^2$, the combined power level of the RF source generators 82 and 84 is at least about 4700 Watts and more desirably at least about 5600 Watts, producing a total source plasma power density of at least about 15 Watts/$cm^2$, and more desirably at least about 17.8 Watts/$cm^2$. The top power level of the top generator 82 produces a top power density, and the side power level of the side generator 84 produces a side power density. The ratio of the top power density and the side power density is at least about 1.5. In a specific embodiment, the top power density is about 13.7 Watts/$cm^2$ to about 16.9 Watts/$cm^2$ (top power level of about 4300–5300 Watts), and the side power density is about 4.1 Watts/$cm^2$ to about 7.6 Watts/$cm^2$ (side power level of about 1300–2300 Watts). The bias power density is about 6.4–11.2 Watts/$cm^2$. Typically, the pressure of the atmosphere in the process chamber is maintained between about 2 and 10 millitorr, with 4–5 millitorr being the preferred pressure range.

The higher source RF power density breaks the process gases into higher ion components. For instance, $SiH^+$, $SiH_2^+$, and $Si_3^+$ ion components are generated from $SiHhd\ 4$ in the chamber. This produces a higher ion density plasma in the chamber and generates a more directional plasma that facilitates gap fill with reduced void formation and with superior gap-filling characteristics even for very aggressive gaps having aspect ratios of about 3:1 to 4:1 and higher. The concentration of the source RF power density above the gaps produces a more uniform deposition of the gap-fill layer over the substrate.

Figure 15:
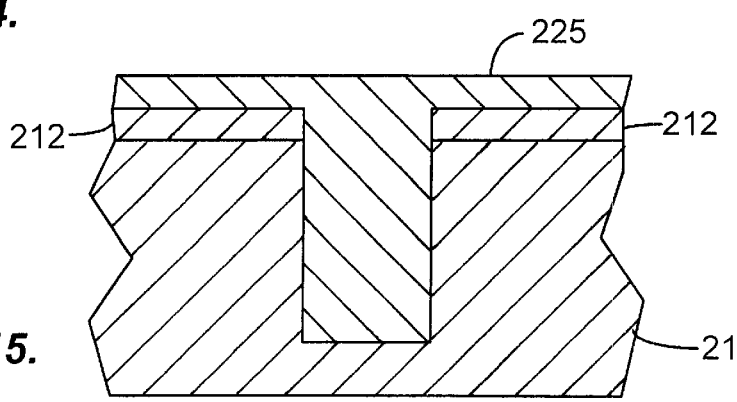
FIG. 15 is a cross-sectional view of the substrate shown in FIG. 13 with a gap-fill layer disposed thereon.

During step 228, the dielectric layer 225 is deposited over substrate 210 and mask layer 212 to fill the gap 214 (shown in FIG. 15) and is concurrently etched by the reactive plasma species, i.e., ions formed from the argon gas and oxygen gas. The source component of the plasma generates the energy that is primarily responsible for the dissociation of the atoms and molecules of the process chamber gases into a plasma, and the bias component of the plasma moves the plasma species to and from the surface of the dielectric layer being deposited. The bias component creates the primary force that conveys deposition ions to the dielectric layer surface for combination therein and sputtering thereof.

Selecting the proper gas mixture and respective flow rates is important to produce plasma species having selected sputtering energy that avoids or minimizes clipping of the trench masks Some sputtering gases such as argon generate high energy ions that sputter the trench mask at a substantial rate relative to the sputter rate of the dielectric trench-file material. The flow rate of such sputtering gases should be controlled relative to those of other process gases to reduce trench mask sputtering. The flow rate of the inert gas may be adjusted at step 230 if desired to optimize deposition rate with minimal trench mask sputtering. For instance, the concentration of the inert gas can be minimized initially to reduce trench mask sputtering and increased over time to increase the overall deposition rate. In an alternative embodiment, the concentration of the inert component such as argon is about 0%. Instead, oxygen gas can be used to generate oxygen ions for sputtering silicon dioxide dielectric material with substantially no sputtering of silicon nitride mask. Although the method has been described for STI, the present invention can be used for other applications including IMD, PMD, etc.

IV. Experiments and Test Results

The following experimental examples are used to illustrate the advantages of the present invention in the dielectric film quality when different aspects of the methods described above are used for filling gaps in STI and IMD applications. The examples were undertaken using a CVD chamber, and in particular, an Ultima HDP-CVD chamber (sized for a 200-mm substrate) fabricated and sold by Applied Materials, Inc., Santa Clara, Calif. The chamber size varies with the substrate size as known to those of skill in the art. For experiments involving 200-mm substrates, the chamber has a volume of about 30 liters or 30,000 cm$^3$. The STI experiments employed silicon substrates which had shallow trenches disposed between islands covered by a silicon nitride trench-mask layer. The trenches were filled by flowing a process gas including $SiH_4$, $O_2$, and Ar into the CVD chamber to deposit a silicon dioxide layer on the substrate. For IMD applications, metal lines including materials such as TiN, Al, and USG were formed on a silicon substrate with gaps between the metal lines to be filled.

In the STI examples shown in FIGS. 16–19, typical process parameters for deposition include a chamber pressure of about 4–10 militorr, a chamber temperature of greater than about 550° C. and less than about 760° C., a bias RF power of 3500 Watts producing a bias power density of 11.2 Watts/cm$^2$, an $SiH_4$ flow rate of about 64 sccm, an $O_2$ flow rate of about 128 sccm and an Ar flow rate of 0–40 sccm.

Figure 16:
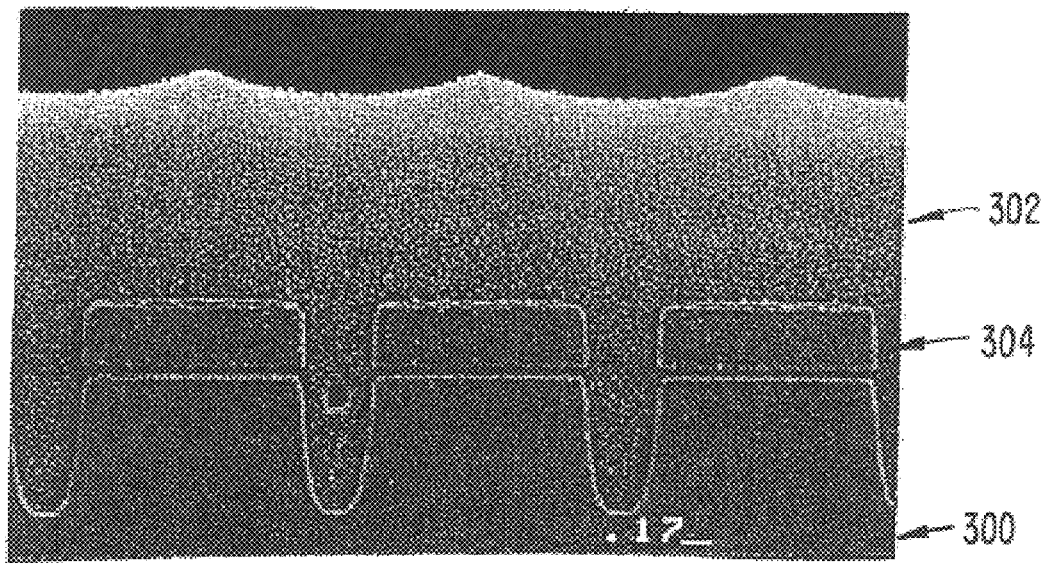
FIG. 16 is an SEM (scanning electron micrograph) cross-sectional view of an STI trench-fill layer formed on a substrate having trenches with an aspect ratio of 3.0:1 using a side RF source power density of 2.1 Watts/cm$^2$ and a top RF source power density of 5.4 Watts/cm$^2$.
Figure 17:
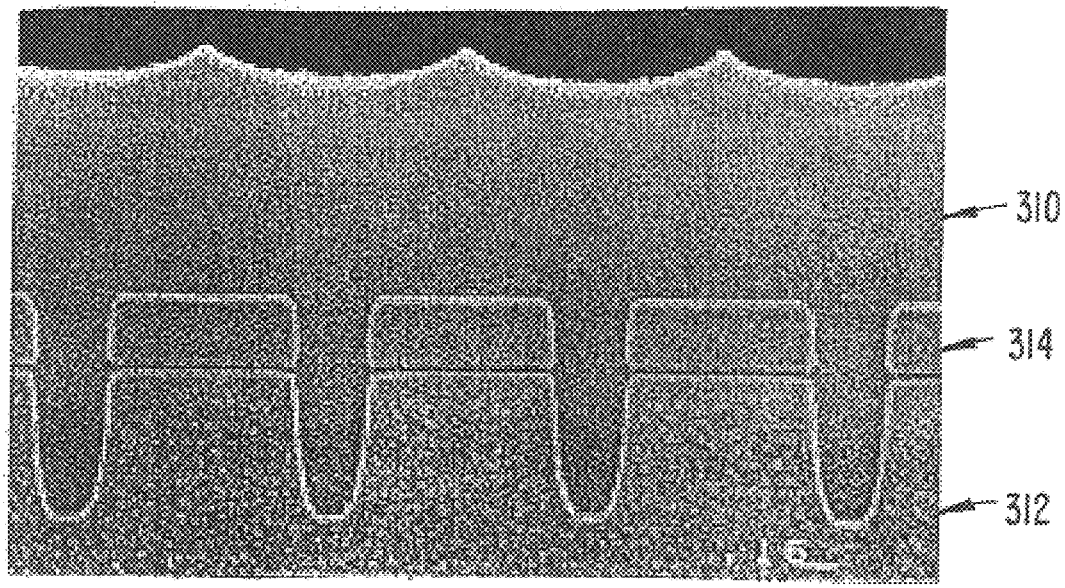
FIG. 17 is an SEM cross-sectional view of an STI trench-fill layer formed on a substrate having trenches with an aspect ratio of 3.3:1 using a side RF source power density of 4.1 Watts/cm$^2$ and a top RF source power density of 10.8 Watts/cm$^2$.

The SEM cross-sectional views of FIGS. 16 and 17 illustrate the effect of source RE power density on the gap-filling characteristics of a silicon dioxide gap-fill layer formed over shallow trenches in a substrate 300. In FIG. 16, the gap-fill layer 302 was deposited over trenches having a width of about 0.17 μm and an aspect ratio of 3.0:1 employing a side RF source power density of 2.0 Watts/cm$^2$ and a top RF source power density of 5.4 Watts/cm$^2$. The D/S (deposition to sputter) ratio was 3.5. At this relatively low source RF power density, a void was observed in the gap-fill layer even though the power concentration was shifted to the top. No clipping of the trench mask layer 304 was observed.

By increasing the source RF power density to a side RE source power density of 4.1 Watts/cm$^2$ and a top RF source power density of 10.8 Watts/cm$^2$, a void-free gap fill layer 310 was formed for an even more aggressive trench having a width of about 0.16 μm and an aspect ratio of 3.3:1 on a substrate 312 with no clipping of the trench mask layer 314, as illustrated in FIG. 17. The D/S ratio was 4.5. The other process conditions were substantially the same as those used in the example of FIG. 16.

Figure 18:
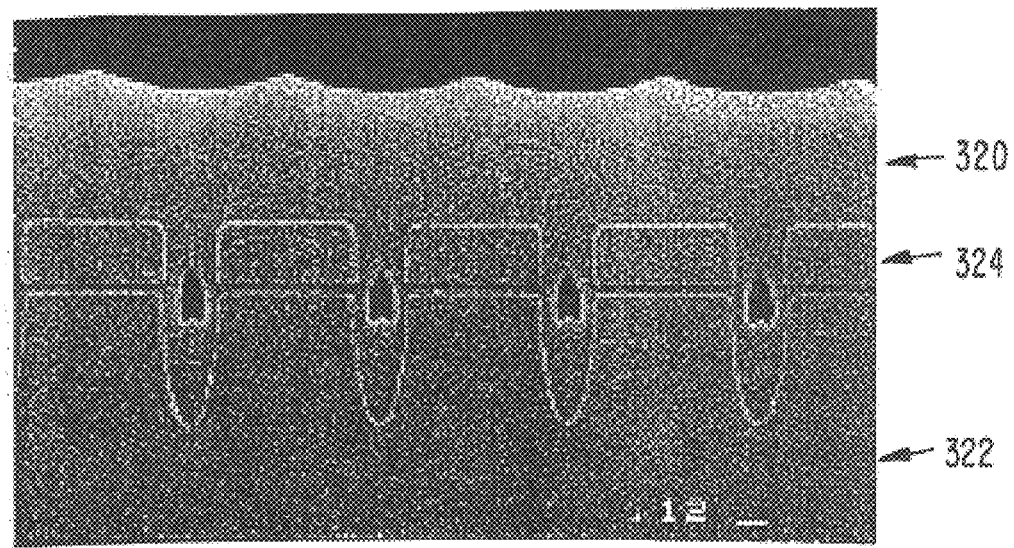
FIG. 18 is an SEM cross-sectional view of an STI trench-fill layer formed on a substrate having trenches with an aspect ratio of 4.2:1 using a side RF source power density of 5.7 Watts/cm$^2$, a top RF source power density of 15.3 Watts/cm$^2$, and a 20-second heating period.
Figure 19:
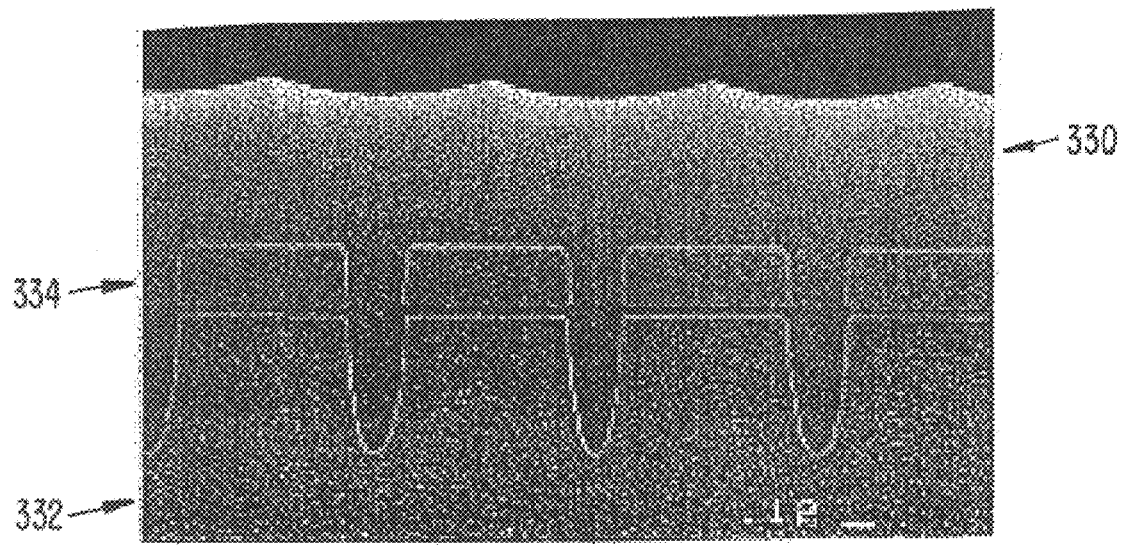
FIG. 19 is an SEM cross-sectional view of an STI trench-fill layer formed on a substrate having trenches with an aspect ratio of 4.2:1 using a side RF source power density of 5.7 Watts/cm$^2$, a top RF source power density of 15.3 Watts/cm$^2$, and a 60-second heating period.

The SEM cross-sectional views of FIGS. 18 and 19 were obtained for trenches having a width of about 0.12 μm and a very high aspect ratio of 4.2:1. The depositions were carried out using a side RF source power density of 5.7 Watts/cm$^2$ and a top RF source power density of 15.3 Watts/cm$^2$. In FIG. 18, a 20-second substrate heating in argon was performed prior to introducing the process gases for depositing the gap-fill layer. The process gases that were introduced into the chamber were given about 6 seconds to flier reduce transient effects before a plasma was formed to deposit the gap-fill layer, The example in FIG. 19 involved a 60-second substrate heating in argon and a 6-second period of process gas flow into the chamber prior to deposition in plasma. In both cases, substrate heating was carried out in argon with a side RF source power density of 5.7 Watts/cm$^2$ and a top RF source power density of 15.3 Watts/cm$^2$. The ratio of the top to side RU source power densities was 2.67. The D/S ratio was 4.5 in both examples. During deposition, the argon level is reduced to about 0–10%, by volume. Voids were formed in the gap-fill layer 320 on the substrate 322 in FIG. 18 with no clipping of the trench mask layer 324. No void was found in the gap-fill layer 330 on the substrate 332 in FIG. 19, and no clipping of the trench mask layer 334 was observed, Void-free gap fill was achieved even for very aggressive gaps by raising the source RF power densities and providing adequate substrate heating to reduce transient effects prior to deposition.

For STI, a reduced level of inert gas such as argon is desirable. Reducing the amount of the inert gas decreases sputtering, thereby reducing the problem of clipping of the trench mask layer or other circuit elements. A decrease in sputtering also reduces redeposition of sputtered material and void formation resulting therefrom. The amount of the inert gas component in the process gas is desirably less than about 40%, by volume for obtaining superior gap-filling characteristics. In a specific embodiment, the amount of the inert gas component is about zero. Note that the trenches in the examples shown in FIGS. 16–20 have side walls that are at least substantially vertical near the opening of the trenches, and are more difficult to fill than trenches with tapered side walls.

Figure 20:
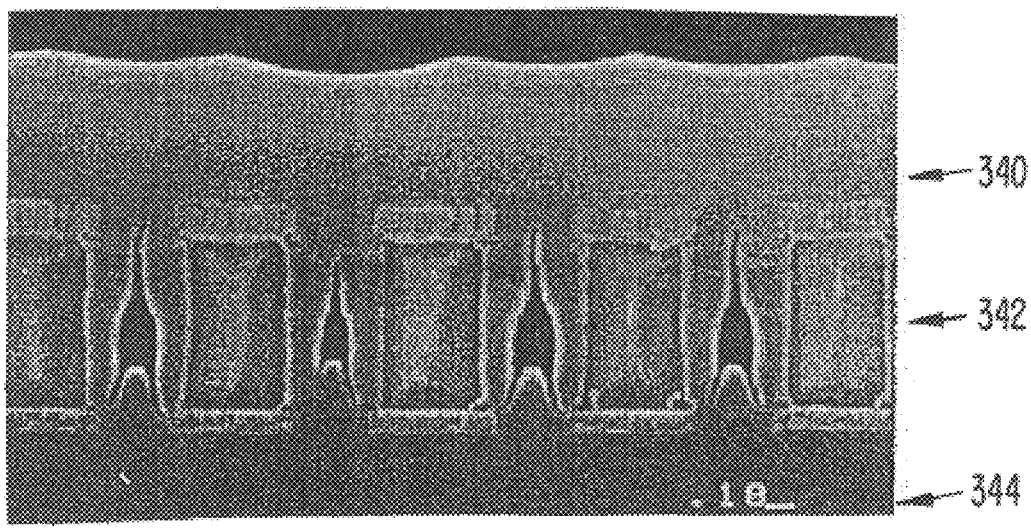
FIG. 20 is an SEM cross-sectional view of an IMD layer formed on gaps having a width of 0.2 $\mu$m and a height of 0.6 $\mu$m using a side RF source power density of 4.1 Watts/cm$^2$ and a top RF source power density of 9.9 Watts/cm$^2$ with about 37% of argon, by volume, in the process gas during deposition of the IMD layer.
Figure 21:
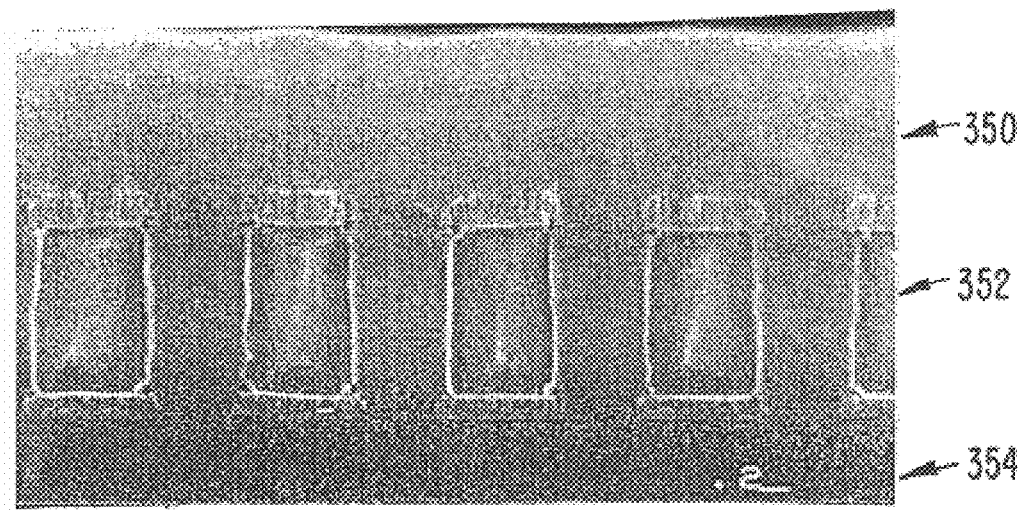
FIG. 21 is an SEM cross-sectional view of an IMD layer formed on gaps having a width of 0.2 $\mu$m and a height of 0.6 $\mu$m using a side RF source power density of 5.7 Watts/cm$^2$ and a top RF source power density of 15.3 Watts/cm$^2$ with about 37% of argon, by volume, in the process gas during deposition of the IMD layer.
Figure 22:
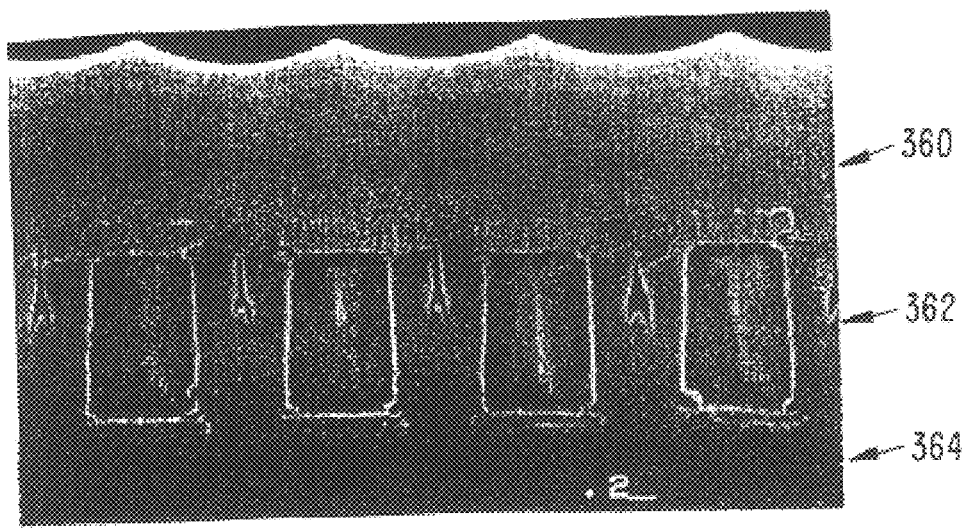
FIG. 22 is an SEM cross-sectional view of an IMD layer formed on gaps having a width of 0.2 $\mu$m and a height of 0.6 $\mu$m using a side RF source power density of 5.7 Watts/cm$^2$ and a top RF source power density of 15.3 Watts/cm$^2$ with no argon in the process gas during deposition of the IMD layer.

FIGS. 20–22 show examples of forming IMD layers over gaps having a width of 0.2 μm and a height of 0.6 μm. Typical process parameters for deposition include a chamber pressure of about 4–10 millitorr, a chamber temperature of greater than about 330° C. and less than about 420° C., a bias RF power of 3500 Watts producing a bias power density of 11.2 Watts/cm$^2$, a $SiH_4$ flow rate of about 87 sccm, an $O_2$ flow rate of about 126 sccm, and an Ar flow rate of 0–126 sccm.

In FIG. 20, the experiment used a side RF source power density of 4.1 Watts/cm$^2$ and a top RF source power density of 9.9 Watts/cm$^2$. The Ar flow rate was 126 sccm. Large voids were formed in the IMD layer 340 between the metal lines 342 on the substrate 344. In FIG. 21, the side RF source power density was raised to 5.7 Watts/cm$^2$ and the top RF source power density was raised to 15.3 Watts/cm$^2$, while the Ar flow rate remained 126 sccm. No void was formed in the IMD layer 350 between metal lines 352 on the substrate 354. The shift of power density to the top above the gaps produces a more uniform deposition over the substrate. In FIG. 22, the Ar flow rate was reduced to zero, while the side and top RF source power densities were maintained at 5.7 Watts/cm$^2$ and 15.3 Watts/cm$^2$, respectively. Small voids were found in the IMD layer 360 between the metal lines 362 on the substrate 364 when argon was eliminated from the process gas. The voids in FIG. 22 were significantly smaller than the voids in FIG. 20.

The SEM cross-sectional views of FIGS. 20–22 illustrate that the use of higher source RF power density generates a higher ion density plasma and more directional deposition to achieve improved gap fill, and the shift of power density to the top above the gaps produces a more uniform deposition of the IMD layer. Unlike STI, clipping of the metal lines is not a problem in IMD applications. Therefore, the amount of the inert gas such as argon need not be minimized to avoid clipping. The presence of argon is advantageous during deposition of the IMD layers because it increases the ion density plasma, resulting in a more directional deposition for improved gap fill. The benefits of an increased ion density plasma offset any potential problems with redeposition of sputter material.

As seen from the above discussion, the use of a higher source plasma power density generates a more directional deposition with superior gap filling characteristics in both the STI and IMD examples. The shift of the concentration of the source plasma power density to the top above the gaps produces a more uniform deposition of the gap-fill layer from the center to the edge of the substrate, The higher source plasma power density causes a more directional plasma oriented toward the gaps for improved gap fill. As a result, less reliance on sputtering is needed to achieve void-free gap fill, such that the likelihood of clipping is reduced and the D/S ratio can be increased from about 2.8–3.3 to about 3.5–6.0.

Heating the substrate in an inert gas plasma and flowing the process gas into the chamber until it reaches steady state or equilibrium before striking a plasma to deposit the gap-fill layer produce superior gap-filling characteristics in the deposited layer. Redeposition of sputtered material is less likely to occur at higher temperatures. Heating the substrate to a high temperature prior to deposition and maintaining the high temperature with the increased source RF power density during deposition are believed to reduce the likelihood of redeposition as well as to generate a higher ion density plasma. Consequently the gap-fill layer that is formed is more uniform with little or no voids.

It is to be understood that the above description is intended to be illustrative and not restrictive. Many embodiments will be apparent to those of skill in the art upon reviewing the above description. By way of example, the inventions herein have been illustrated primarily with regard to STI and IMD applications, but they are not so limited. For instance, the use of increased source RF power density with higher concentration at the top can be used to deposit more uniform PMD layers as well phosphosilicate glass (PSG) gap-fill layers having phosphorus dopants or other doped silicon layers. The scope of the invention should, therefore, be determined not with reference to the above description, but instead should be determined with reference to the appended claims along with their fall scope of equivalents.

What is claimed is:

1. A method for depositing a layer on a surface of a substrate having a trench and being disposed in a process chamber, the substrate having a side edge generally surrounding the surface, the method comprising:

flowing a process gas into the process chamber, the process gas including silicon, oxygen, and an inert component, the concentration of the inert component in the process gas being less than about 40%, by volume; and forming a plasma in the process chamber to deposit the layer on the surface of the substrate and fill the trench, the forming step including coupling source plasma energy into the process chamber at a total power density of at least about 15 Watts/cm$^2$.

2. The method of claim 1 wherein the energy is coupled into the process chamber by coupling a top RF power source at a top RF power level with a top portion of the process chamber above the surface of the substrate to produce a top power density and coupling a side RF power source at a side RF power level with a side portion of the process chamber generally surrounding the side edge of the substrate to produce a side power density, the total power density being equal to the sum of the top power density and the side power density.

3. The method of claim 2 wherein the top RF power source comprises a top coil being powered at the top RF power level and the side RF power source comprises a side coil being powered at the side RF power level.

4. The method of claim 2 wherein the top power density and the side power density have a ratio of at least about 1.5.

5. The method of claim 4 wherein the top power density and the side power density have a ratio of at least about 2 and less than about 4.

6. The method of claim 4 wherein the top power density is at least about 13.7 Watts/cm$^2$ and the side power density is at least about 4.1 Watts/cm$^2$.

7. The method of claim 6 wherein the top power density is less than about 16.9 Watts and the side power density is less than about 7.6 Watts/cm$^2$.

8. The method of claim 1 wherein the total power density is at least than about 17.8 Watts/cm$^2$.

9. The method of claim 1 wherein the concentration of the inert component in the process gas is less than about 15%, by volume.

10. The method of claim 1 wherein the concentration of the inert component in the process gas is about 0%.

11. The method of claim 1 wherein the process gas comprises silane, oxygen, and argon.

12. The method of claim 1 wherein the process gas further comprises at least one dopant.

13. The method of claim 1 wherein the surface of the substrate has an area of about 314 cm$^2$, and wherein the energy is coupled into the process chamber inductively at a total power level of at least about 4700 Watts.

14. The method of claim 1 further comprising, prior to flowing the process gas into the process chamber and forming the plasma in the process chamber to deposit the layer on the surface of the substrate, the steps of:

introducing an inert gas into the process chamber;

forming a plasma in the process chamber to heat the substrate to a preset desired temperature; and terminating the plasma upon reaching the preset desired temperature for the substrate.

15. The method of claim 14 wherein the process gas is flowed into the process chamber without plasma excitation for a preset period of time prior to forming the plasma in the process chamber to deposit the layer on the surface of the substrate.

16. The method of claim 15 wherein the process gas is flowed into the process chamber without plasma excitation until the process gas flow and distribution achieve a generally steady state in the process chamber.

17. The method of claim 14 wherein the preset desired temperature is at least substantially equal to the temperature of the substrate during deposition of the layer on the surface of the substrate.

18. The method of claim 14 wherein the preset desired temperature is at least about 550° C.

19. The method of claim 18 wherein the preset desired temperature is about 600–760° C.

20. The method of claim 1 further comprising maintaining the substrate at a temperature of at least about 550° C. during deposition of the layer on the surface of the substrate.

21. The method of claim 20 wherein the substrate is maintained at a temperature of about 600–760° C. during deposition of the layer on the surface of the substrate.

22. A method for depositing a layer on a surface of a substrate having a trench and being disposed in a process chamber, the method comprising:

introducing an inert gas into the process chamber;

forming a plasma in the process chamber to heat the substrate to a preset desired temperature;

terminating the plasma upon reaching the preset desired temperature for the substrate;

flowing a process gas into the process chamber without plasma excitation until the process gas flow and distribution achieve a generally steady state in the process chamber; and forming a plasma in the process chamber to deposit the layer on the surface of the substrate and fill the trench.

23. The method of claim 22 wherein the preset desired temperature is at least about 300° C.

24. The method of claim 23 wherein the preset desired temperature is at least about 550° C.

25. The method of claim 24 wherein the preset desired temperature is about 600–760° C.

26. The method of claim 22 wherein the process gas comprises silicon, oxygen, and an inert component, the concentration of the inert component in the process gas being less than about 40%, by volume.

27. The method of claim 22 wherein the step of forming the plasma in the process chamber to deposit the layer on the surface of the substrate and fill the trench includes coupling source plasma energy into the process chamber at a total power density of at least about 15 Watts/cm$^2$.

28. The method of claim 27 wherein the energy is coupled into the process chamber by coupling a top RF power source at a top RF power level with a top portion of the process chamber above the surface of the substrate to produce a top power density; and coupling a side RF power source at a side RF power level with a side portion of the process chamber generally surrounding a side edge of the substrate around the surface of the substrate to produce a side power density, the total power density being equal to the sum of the top power density and the side power density.

29. The method of claim 28 wherein the top power density and the side power density have a ratio of at least about 1.5.

* * * * *